(12) United States Patent
Hayashi et al.

(10) Patent No.: US 7,443,212 B2
(45) Date of Patent: Oct. 28, 2008

(54) SEMICONDUCTOR INTEGRATED CIRCUIT CONTROLLING OUTPUT IMPEDANCE AND SLEW RATE

(75) Inventors: Atsuhiro Hayashi, Akisima (JP); Takemi Negishi, Honjo (JP); Hiroshi Toyoshima, Akiruno (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/889,098

(22) Filed: Aug. 9, 2007

(65) Prior Publication Data

US 2007/0296470 A1 Dec. 27, 2007

Related U.S. Application Data

(63) Continuation of application No. 11/487,348, filed on Jul. 17, 2006, now Pat. No. 7,262,643, which is a continuation of application No. 10/829,380, filed on Apr. 22, 2004, now Pat. No. 7,176,729.

(30) Foreign Application Priority Data

Apr. 23, 2003 (JP) .............................. 2003-118528

(51) Int. Cl.
  *H03B 1/00* (2006.01)
  *H03K 19/0175* (2006.01)
(52) U.S. Cl. .................. 327/108; 327/112; 326/30; 326/82; 326/83
(58) Field of Classification Search .................. None
  See application file for complete search history.

(56) References Cited

U.S. PATENT DOCUMENTS

| | | | | |
|---|---|---|---|---|
| 5,602,494 A | * | 2/1997 | Sundstrom | .................... 326/39 |
| 6,054,881 A | * | 4/2000 | Stoenner | ..................... 327/112 |
| 6,087,847 A | | 7/2000 | Mooney et al. | |
| 6,094,069 A | * | 7/2000 | Magane et al. | ................. 326/83 |
| 6,307,424 B1 | * | 10/2001 | Lee | ............................. 327/530 |
| 6,366,867 B2 | | 4/2002 | Sine et al. | |
| 6,414,525 B2 | * | 7/2002 | Urakawa | ..................... 327/112 |
| 6,538,464 B2 | | 3/2003 | Muljono et al. | |
| 6,628,223 B2 | * | 9/2003 | Nagano | ..................... 341/155 |
| 6,642,740 B2 | * | 11/2003 | Kim et al. | ..................... 326/30 |
| 6,744,287 B2 | | 6/2004 | Kennedy et al. | |
| 7,093,041 B2 | * | 8/2006 | Gasparik | .................... 710/100 |
| 2002/0030523 A1 | | 3/2002 | Muljono et al. | |
| 2002/0190762 A1 | | 12/2002 | Mooney et al. | |
| 2003/0107449 A1 | * | 6/2003 | Gonzalez et al. | ........... 333/17.3 |

(Continued)

FOREIGN PATENT DOCUMENTS

JP 10-242835 9/1998

(Continued)

*Primary Examiner*—Tuan T Lam
(74) *Attorney, Agent, or Firm*—Mattingly, Stanger, Malur & Brundidge, P.C.

(57) ABSTRACT

The present invention provides a semiconductor integrated circuit that can perform impedance control and slew rate control independently of each other and simplify the structure of a control circuit. An output circuit comprising plural output MOSFETs connected in parallel is used, from among the plural output MOSFETs, the number of output MOSFETs to be turned on is selected by a first control means to control output impedance, and slew rate is controlled by a second control means controlling a drive signal of the output MOSFETs to be turned on.

4 Claims, 39 Drawing Sheets

| U.S. PATENT DOCUMENTS | | | | FOREIGN PATENT DOCUMENTS | | |
|---|---|---|---|---|---|---|
| 2003/0128047 A1 | 7/2003 | Humphey | | JP | 2001-156618 | 6/2001 |
| 2003/0218477 A1* | 11/2003 | Jang et al. ................ 326/30 | | JP | 2002-135102 | 5/2002 |
| 2004/0004494 A1* | 1/2004 | Song .......................... 326/30 | | | | |
| 2004/0008054 A1* | 1/2004 | Lesea et al. ............... 326/30 | | * cited by examiner | | |

| IMPEDANCE CODE | | OPERATING BUFFERS | | DQ IMPEDANCE |
|---|---|---|---|---|
| IC1 | IC0 | | (NUMBER) | |
| 0 | 0 | NONE | 0 | ∞ |
| 0 | 1 | 100~102 | 3 | R |
| 1 | 0 | 110~122 | 6 | R/2 |
| 1 | 1 | 100~122 | 9 | R/3 |

FIG. 5

| SLEW RATE CODE | | | PMOS WHICH ARE ON STATE | ON RESISTANCE OF PRE BUFFERS | OUTPUT SLEW RATE |
|---|---|---|---|---|---|
| SR<2> | SR<1> | SR<0> | | | |
| 1 | 1 | 1 | 40~42 | SMALL | BIG |
| 1 | 1 | 0 | 40,41 | ↑ | ↑ |
| 1 | 0 | 1 | 40,42 | | |
| 1 | 0 | 0 | 40 | | |
| 0 | 1 | 1 | 41,42 | | |
| 0 | 1 | 0 | 41 | ↓ | ↓ |
| 0 | 0 | 1 | 42 | BIG | SMALL |
| 0 | 0 | 0 | NONE | ∞(PROHIBIT) | — |

FIG. 6

| BUFFER GROUPS CONTROLLED BY SLEW RATE | IMPEDANCE CODE COMBINATION (IC1,IC0) | | | |
|---|---|---|---|---|
| | 0,0 | 0,1 | 1,0 | 1,1 |
| 20 | ∞ | 3*R | 1.5*R | R |
| 21 | ∞ | 3*R | 1.5*R | R |
| 22 | ∞ | 3*R | 1.5*R | R |
| TOTAL | ∞ | R | R/2 | R/3 |

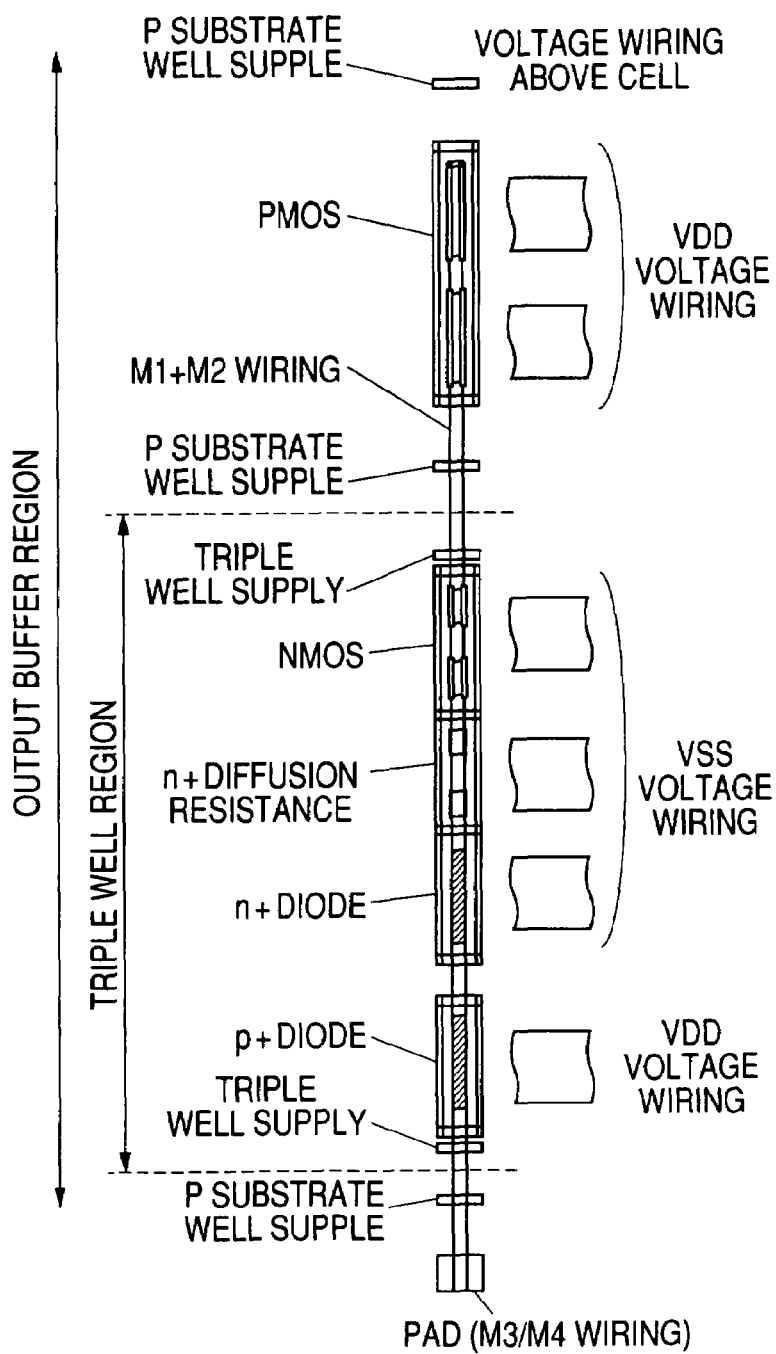
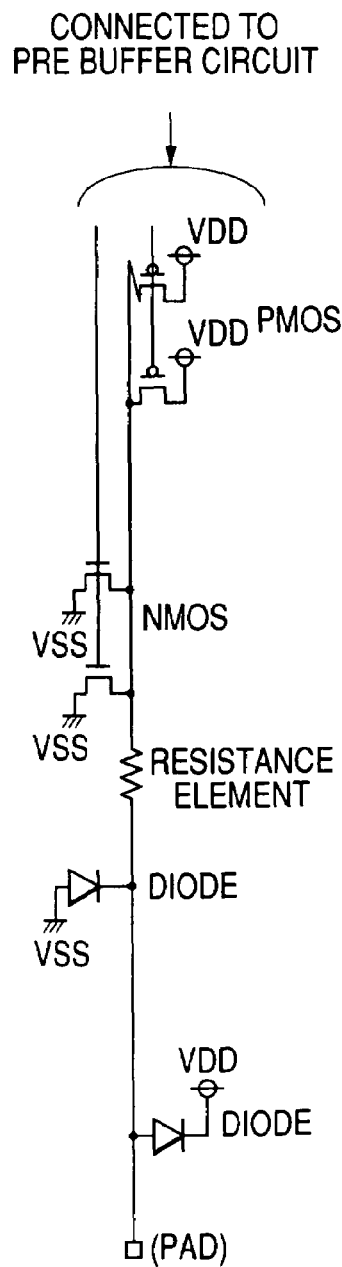
FIG. 16(a)
FIG. 16(b)

SEMICONDUCTOR INTEGRATED CIRCUIT CONTROLLING OUTPUT IMPEDANCE AND SLEW RATE

CROSS-REFERENCE

This is a Continuation Application of U.S. Ser. No. 11/487,348, filed Jul. 17, 2006 (now U.S. Pat. No. 7,262,643), which is Continuation Application of U.S. Ser. No. 10/829,380, filed Apr. 22, 2004 (now U.S. Pat. No. 7,176,729).

CLAIM OF PRIORITY

The present invention claims priority from Japanese application JP 2003-118528 filed on Apr. 23, 2003, the content of which is hereby incorporated by reference into this application.

FIELD OF THE INVENTION

The present invention relates to a semiconductor integrated circuit, and more particularly to a circuit technique suitably used for a semiconductor integrated circuit that enables data transfer at a high frequency on a system.

BACKGROUND OF THE INVENTION

To perform data transfer between a memory LSI (large scale integrated circuit) and an MPU (microprocessor) at a high speed (high frequency), impedances of transfer systems must be matched to reduce reflection-induced distortion of transfer waveforms. Some high-speed synchronous SRAM (static random access memory) products achieve impedance matching by adjusting impedance of an output driver to a resistance value of a resistance element connected to a dedicated LSI pin.

Transition time (rising/falling edges) during output of data to be transferred should be preferably delayed up to the limit of transfer frequency to suppress (1) signal reflection within package, and (2) simultaneous switching output noise due to package inductor (waveform disturbance due to ringing). Accordingly, output transition time (slew rate) must be controlled so that a data window width during data transfer is maximized. In high-speed synchronous SRAM products, slew rate control has been performed by load control or the like on an LSI mounting board, not by an output driver. The investors have found the existence of the following official gazettes relating to the above-mentioned output impedance control and slew rate control by investigation into prior arts after the present invention.
[Patent publication 1] JP-A No. 242835/1998
[Patent publication 2] JP-A No. 156618/2001
[Patent publication 3] JP-A No. 135102/2002

In patent publication 1, a transistor for output impedance control is disposed independently of a transistor for slew rate control. Rise time is controlled by applying shot pulses to the gate of the transistor for slew rate control, and an output voltage level is determined by the transistor for impedance control. In this way, slew rate and impedance can be controlled independently.

In patent publication 2, an output circuit is provided with open drain buffers that increase sequentially in transistor size, and a slew rate control system has an n-bit counter comprising PLL, frequency divider, EOR, pulse generator, and delayer. A counter is incremented or decremented every half cycle of a clock generated by PLL, and transistors (small-size transistors) having higher impedance are successively turned on earlier, or transistors having lower impedance are successively turned off earlier, whereby a level rises (falls) n/2 cycle later. An open drain buffer for impedance control is newly added to finally control impedance. A slew rate control device for thus stabilizing slew rate is disclosed.

In patent publication 3, an impedance matching circuit comprises a third transistor of first conduction type disposed between a serial connection point between a first transistor and a second transistor, and an external terminal, and a fourth transistor of second conduction type connected in parallel with it. Impedance matching with transmission lines is achieved by parallel combined impedance between the third transistor of the first conduction type and the fourth transistor of the second conduction type. Gate widths of individual transistors forming the impedance matching circuit are reduced to reduce the occupation area of an output circuit having a slew rate control function and an impedance matching function within a chip.

With the technique disclosed in the patent publication 1, since different transistors are used for impedance control and slew rate control, the number of transistors connected to LSI pins increases and pin capacity increases. There is a problem in that this parasitic capacitance increases reflection noise in signal transfer. With the technique disclosed in patent publication 2, a final impedance value is determined in the state in which the size of buffer to perform slew rate control is fixed, and the size of buffer to perform impedance control is variable. Therefore, there is a problem in that, when manufacturing process and operating environment change, a driving force of slew rate control buffer changes, and rise/fall time changes depending on conditions. With the technique disclosed in patent publication 3, since a transistor for slew rate control is connected in series with a transistor for impedance matching, slew rate and impedance cannot be set independently. Also, when manufacturing process and operating environment change, slew rate changes.

SUMMARY OF THE INVENTION

An object of the present invention is to provide a semiconductor integrated circuit that can perform impedance control and slew rate control independently of each other and simplify the structure of a control circuit. Another object of the present invention is to provide a semiconductor integrated circuit that makes an impedance ratio constant in any output voltages regardless of a setting value. Another object of the present invention is to provide a semiconductor integrated circuit that includes an output circuit that keeps a slew rate quantity constant as long as impedance is constant, even if combinations of MOSFETs to set impedance to a setting value change. Another object of the present invention is to provide a semiconductor integrated circuit that includes an output circuit and an input circuit that are highly integrated. Another object of the present invention is to provide an easy-to-use semiconductor integrated circuit that can increase a data transfer rate on a system. The above-mentioned and other objects and novel characteristics of the present invention will become apparent from the description of this specification and the accompanying drawings.

A typical disclosure of the invention is summarized in brief as follows. An output circuit comprising plural output MOSFETs connected in parallel is used, from among the plural output MOSFETs, the number of output MOSFETS to be turned on is selected by a first control means to control output impedance, and slew rate is controlled by a second control means controlling a drive signal of the output MOSFETs to be turned on.

Another typical disclosure of the invention is summarized in brief as follows. An input circuit that receives input signals supplied from an external terminal is provided with a terminal circuit that is connected to the external terminal and includes plural MOSFETs connected in parallel. The number of the plural MOSFETs to be turned on is controlled by a third control means to control a resistance value of terminal resistance.

Another typical disclosure of the invention is summarized in brief as follows. For an output circuit to an external terminal of which output nodes of plural output MOSFETs connected in parallel are connected, the number of the plural output MOSFETs to be turned on is selected by a first control means to control output impedance, and slew rate is controlled by controlling a drive signal of the output MOSFETs turned on by a second control means. For an input circuit that receives input signals supplied from the external terminal, a terminal circuit including plural MOSFETs connected in parallel is connected to the external terminal through a switch circuit. The number of the plural MOSFETs to be turned on is controlled by a third control means to control a resistance value of terminal resistance.

BRIEF DESCRIPTION OF THE DRAWINGS

FIG. 5 illustrates one embodiment of a method of setting a driving force of the output prebuffer 3 of FIG. 2;

FIG. 6 illustrates impedances for each of the output buffer groups 20 to 22 of FIG. 1;

FIGS. 16A and 16B are structure diagrams of one embodiment of output buffer cell according to the present invention;

DETAILED DESCRIPTION OF THE INVENTION

Figure 1:
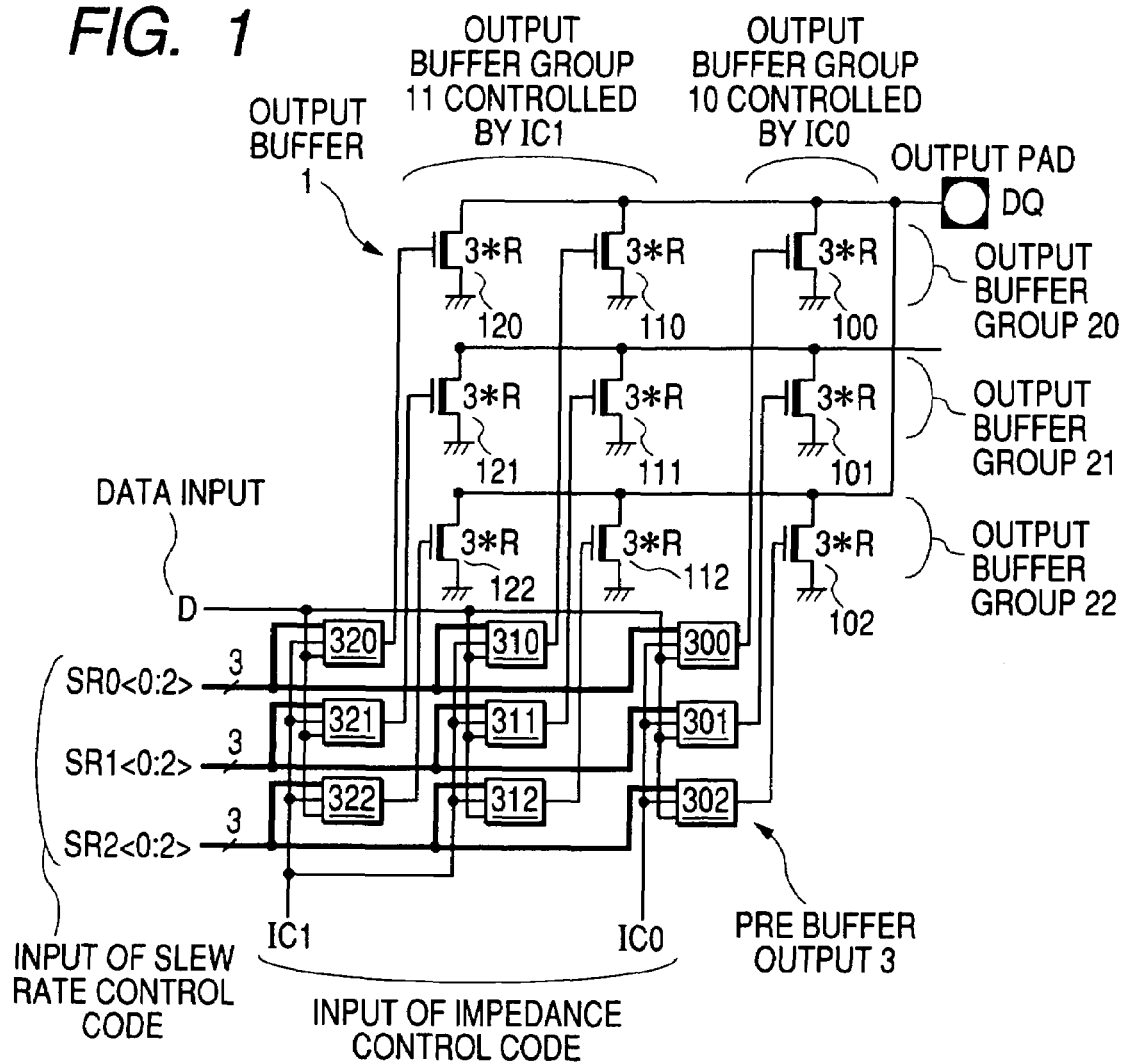
FIG. 1 is a schematic circuit diagram showing one embodiment of output buffers disposed in a semiconductor integrated circuit according to the present invention.

FIG. 1 is a schematic circuit diagram showing one embodiment of output buffers provided in a semiconductor integrated circuit according to the present invention. Output buffers 1 of this embodiment are directed to an output circuit of an open drain form. The output buffers 1 comprise plural N-channel output MOSFETs 100-122. These output MOSFETs 100-122 are connected in parallel so that their drains are commonly connected to an output terminal DQ and their sources are applied with a ground potential of the circuit. The output MOSFETs 100-122, to explain them more precisely, are nine MOSFETs 100-102, 110-112, and 120-122 and they are arranged in a matrix with three rows and three columns. Though there is no particular limitation, the output nine MOSFETs 100-122 are formed to be equal to each other in on-state resistance value, which is, e.g., 3*R (=3×R).

An output prebuffer 3 is disposed correspondingly to each of the above-mentioned output MOSFETs 100-122. The output prebuffers 3 comprise nine prebuffers 300-302, 310-312, and 320-322 respectively corresponding to the output MOSFETs 100-122, arranged in a matrix with three rows and three columns. A drive signal formed by the above-mentioned nine output prebuffers 300-322 is passed to gates of the above-mentioned corresponding output MOSFETs 100-122.

Among the output MOSFETs 100-122, the output MOSFETs 100-102 are designated as an output buffer group 10 corresponding to impedance control code IC0, and the output MOSFETs 110-112 and 120-122 are designated as an output buffer group 11 corresponding to impedance control code IC1. Among the output MOSFETs 100-122, the output MOSFETs 100, 110, and 120 are designated as an output buffer group 20, the output MOSFETs 101, 111, and 121 as an output buffer group 21, and the output MOSFETs 102, 112, and 122 as an output buffer group 22.

The output prebuffers 300-302 corresponding to the output MOSFETs 100-102 of the output buffer group 10 are supplied with the impedance control code IC0. The output prebuffers 310-312, and 320-322 corresponding to the output MOSFETs 110-122 of the output buffer group 11 are supplied with the impedance control code IC1.

The prebuffers 300, 310, and 320 disposed correspondingly to the output MOSFETs of the output buffer group 20, the prebuffers 301, 311, and 321 disposed correspondingly to the output MOSFETs of the output buffer group 21, the prebuffers 302, 312, and 322 disposed correspondingly to the output MOSFETs of the output buffer group 22 are supplied with slew rate control codes SR0, SR1, and SR3, respectively. These slew rate control codes SR0, SR1, and SR3 respectively consist of 3-bit signals as shown by <0:2>. The nine output prebuffers 300-322 are supplied with data input D. The data input D is a data signal that is formed in an internal circuit not shown in the figure, and is outputted outside the semiconductor integrated circuit through the output terminal DQ.

In this embodiment, if an on-state resistance value of the output MOSFETs 100-122 is assumed as 3*R (=3×R), total impedance is R in the output buffer group 10 controlled by the impedance control code IC0, and R/2 in the output buffer group 11 controlled by the impedance control code IC1.

In this embodiment, as described above, the output buffer groups are divided into the output buffer group 20 controlled by the slew rate control code SR0<0:2>, the output buffer group 21 controlled by the slew rate control code SR1<0:2>, and the output buffer group 22 controlled by the slew rate control code SR2<0:2>. In the output prebuffers 3, constants of same-size prebuffer circuits connected to the output MOSFETs are the same.

Figure 2:
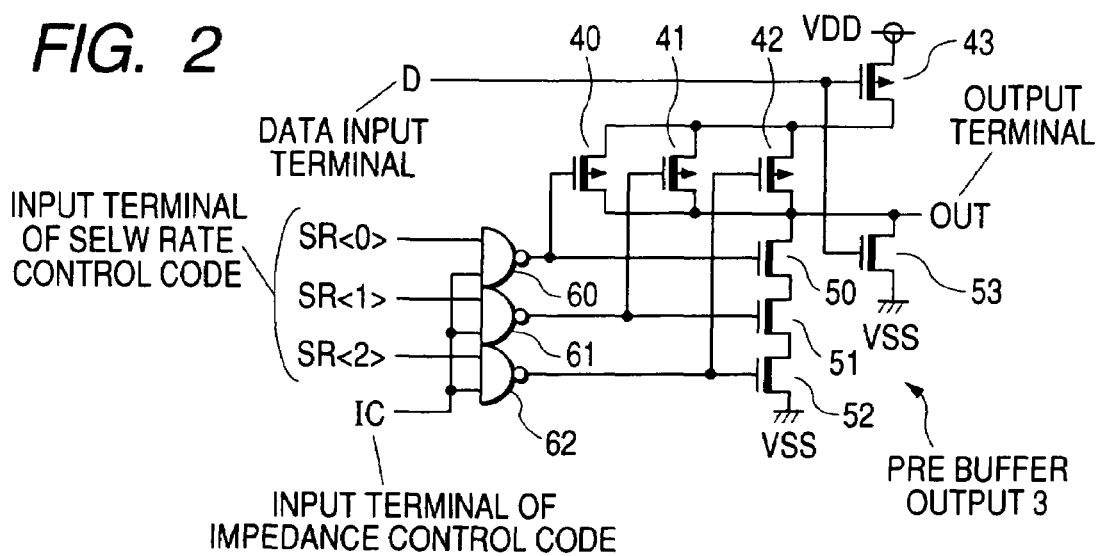
FIG. 2 is a schematic circuit diagram of one embodiment of output prebuffers in FIG. 1.

FIG. 2 shows a schematic circuit diagram of one embodiment of the output prebuffers 3 in FIG. 1. In the figure, D designates a data input terminal, and OUT designates an output terminal which is connected to gates of the output MOSFET 100 and other MOSFETs, which are output buffers. IC designates an impedance control code input terminal, and SR<0>, SR<1>, and SR<2> respectively designate slew rate control code input terminals.

P-channel MOSFETs 40-42 are connected in parallel, and drains commonly connected are connected to the output terminal OUT. Commonly connected sources of the P-channel MOSFETs 40-42 are supplied with power voltage VDD by a P-channel MOSFET Q43 that receives output data supplied from the data input terminal D. Between the output terminal OUT and a ground potential VSS of the circuit is disposed an N-channel MOSFET Q53, which is subjected to switch control by output data supplied from the data input terminal D.

Between the output terminal OUT and the ground potential VSS of the circuit, the N-channel MOSFETs 50-52 are disposed in series. Gates of the P-channel MOSFETs 40-42 are respectively connected with gates of the N-channel MOSFETs 50-52 to convey output signals of NAND gate circuits 60, 61, and 62. The impedance control code IC0 or IC1 is supplied from the input terminal IC to one input of each of the NAND gate circuits 60-62. One of slew rate control codes SR0<0:2>, and SR1<0:2>, and SR3<0:2> is supplied from the input terminals SR<0>, SR<1>, and SR<2> to the other input of the NAND gate circuits 60-62.

The output prebuffers of this embodiment are selected by the impedance control code input terminal IC. Therefore, in FIG. 2, by supplying the IC0 or IC1 to the impedance control code input terminal IC, an output buffer group (10, 11) to be brought into operation can be selected. A combination of P-channel MOSFETs 40-42 to be turned on is selected by supplying one of the SR0-SR2<0:2> to the slew rate control code input terminal to change a load driving force of the output prebuffers (drain-source on-state resistance). In short, the rise time of a drive signal conveyed to gates of the output MOSFETs 100 and the like are adjusted.

The N-channel output MOSFETs 100 to 122 making up the output buffers 1 of FIG. 1 can be replaced by P-channel output MOSFETs. In other words, the P-channel output MOSFETs may be disposed at the power voltage side to output high-level output signals from the output terminal DQ.

Figures 3, 4:
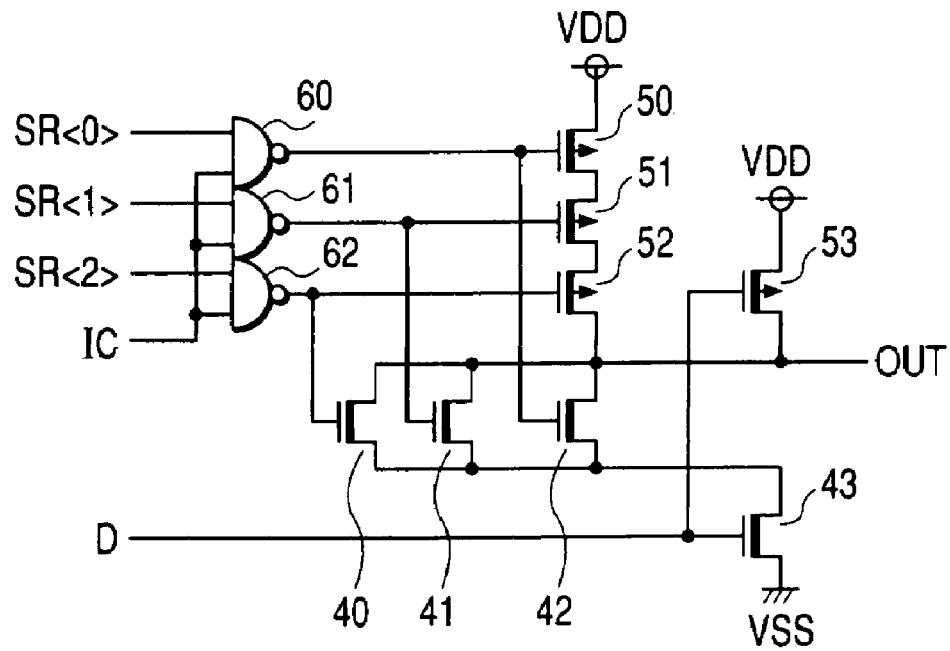
FIG. 3 is a schematic circuit diagram showing one embodiment of an output prebuffer driving an output buffer using P-channel output MOSFETs.
FIG. 4 illustrates one embodiment of an impedance setting method for the output buffers 1 shown in FIG. 1 according to the present invention.

FIG. 3 shows a schematic circuit diagram of one embodiment of output prebuffers driving output buffers using the above-mentioned P-channel output MOSFETs. In the figure, like FIG. 2, D designates a data input terminal, and OUT designates an output terminal which is connected to gates of the output MOSFETs 100, which are output buffers. Like FIG. 2, IC designates an impedance control code input terminal, and SR<0>, SR<1>, and SR<2> respectively designate slew rate control code input terminals.

The output prebuffers of this embodiment are reversed with a connection relationship between the P-channel MOSFETs and the N-channel MOSFETs of FIG. 2. In other words, a drive signal for turning on P-channel output MOSFETs is formed by N-channel MOSFETs 40-42 connected in parallel, and an N-channel MOSFET 43 receiving data D is used as a switch for supplying ground potential VSS of the circuit. MOSFET that resets an output terminal OUT to a high level correspondingly to the data D is a P-channel MOSFET 53. P-channel MOSFETs 50-52 are connected in series and disposed between the output terminal and the power voltage VDD. In place of NAND gate circuits, AND gate circuits are used as gate circuits 60-62 that receive the impedance control code IC and the slew rate control codes SR<0>, SR<1>, and SR<2>.

FIG. 4 illustrates one embodiment of an impedance setting method for the output buffers 1 shown in FIG. 1 according to the present invention. By setting the impedance control codes IC0 and IC1, an output buffer group to be brought into operation can be selected and output impedance can be set between infinity and R/3. In other words, when IC1 and IC0 are 00, output impedance is set to infinity, assuming that there is no output MOSFET to be brought into operation. When IC1 and IC0 are 01, three output MOSFETs 100-102 operate, and output impedance is set to R. When IC1 and IC0 are 10, six output MOSFETs 110-112 and 130-132 operate, and output impedance is set to R/2. When IC1 and IC0 are 11, all of the nine output MOSFETs 100-102, 110-112, and 130-132 operate, and output impedance is set to R/3.

FIG. 5 illustrates one embodiment of a method of setting a driving force of the output prebuffer 3 of FIG. 2. By setting the slew rate control codes SR<0>, SR<1>, and SR<2>, a combination of P-channel MOSFETs 40 to 42 to be turned on can be selected, a load driving force (on-state resistance) of the circuit can be changed, and an output slew rate can be set to a smaller value. In other words, by the slew rate control codes SR<0>, SR<1>1, and SR<2> consisting of three bits, combinations of the P-channel MOSFETs 40 to 42 turned on correspondingly to seven values except the value 000 are set so that seven on-state resistance values can be set. This assumes that the MOSFETs 40-42 are set so as to have different on-state resistance values, for example, MOSFET 42>MOSFET 41 and MOSFET 40//41>MOSFET 40. Herein, MOSFET 40//41 denotes a parallel synthesized resistance value of MOSFETs 40 and 41.

FIG. 6 illustrates impedances for each of the output buffer groups 20 to 22 of FIG. 1. In the embodiment of FIG. 1, by changing slew rate codes to be inputted to output prebuffers corresponding to the output buffer groups 20-22, driving waveforms for turning on the output buffer groups are changed. In this example, even if impedance codes change, the ratio of impedances among the output buffer groups 20-22 is kept constant. Therefore, for example, even if temperature changes from T0 to T1 and output impedance control codes (IC1, IC0) change from (1, 0) to (1, 1), since impedance is R/2 [T=T0] and R/3 [T=T1], impedances among the output buffer groups 20-22 are also kept constant (1.5*R[T=T0]=R [T=T1]). Therefore, slew rate is also kept constant.

In the above-mentioned embodiment, impedance control and slew rate control can be performed independently of each other, and the configuration of a control circuit can be simplified. Moreover, as MOSFETs to perform impedance control and MOSFETs to perform slew rate control, common output MOSFETs are used, so that pin capacity can be reduced in comparison with the case where different buffers are respectively disposed for the two types of MOSFETs. Even if environmental conditions such as temperature, voltage, and the like change and a combination of output MOSFETs for setting impedance to a setting value changes, slew rate can be kept constant as long as impedance is constant.

Figure 7:
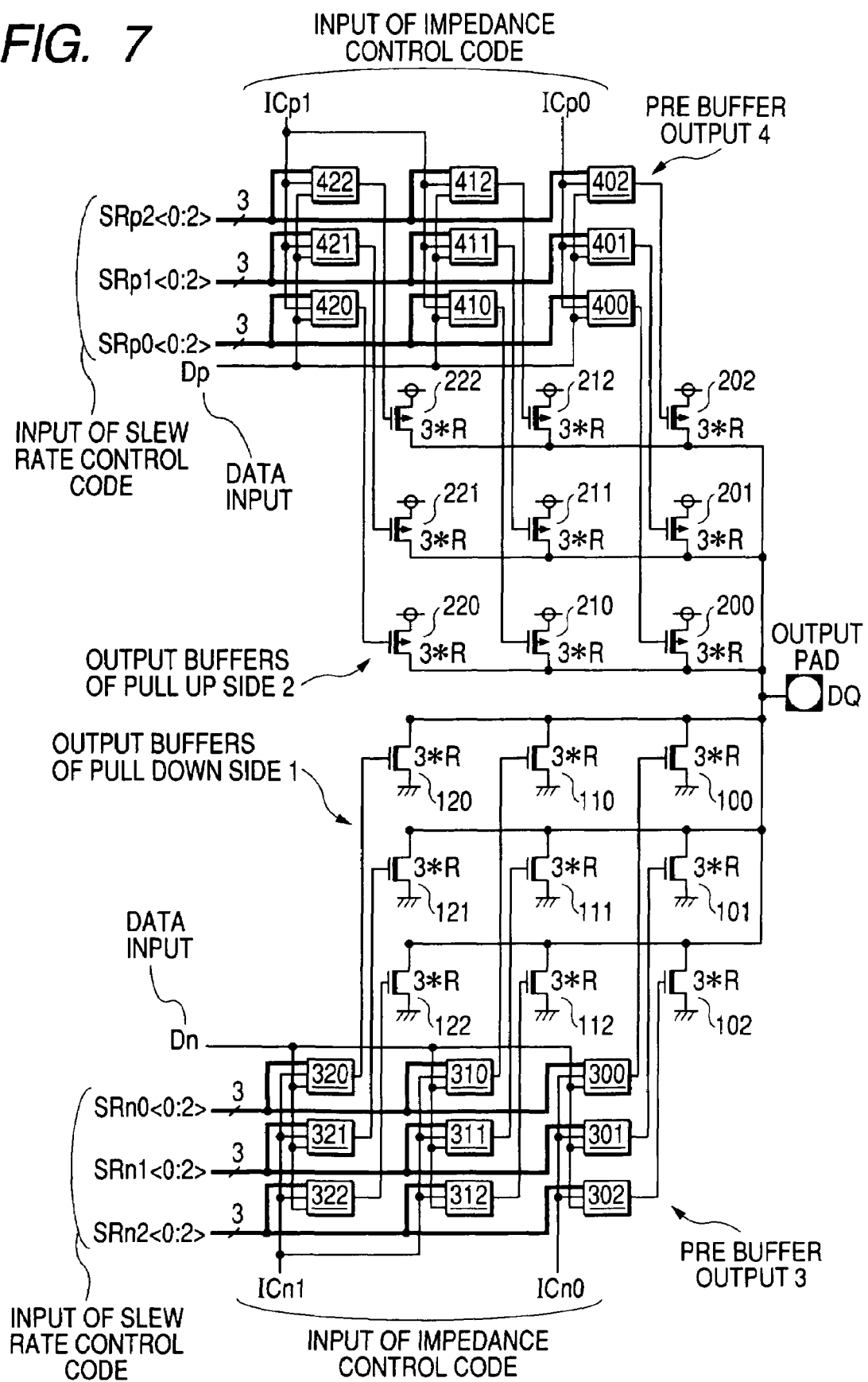
FIG. 7 is a schematic circuit diagram showing another embodiment of output buffers provided in a semiconductor integrated circuit according to the present invention.

FIG. 7 is a schematic circuit diagram showing another embodiment of output buffers provided in a semiconductor integrated circuit according to the present invention. In this embodiment, the output buffers consist of a combination of output buffers 1 of pull down side, as shown in FIG. 1, that send high-level and low-level output signals from the output terminal DQ, and output buffers 2 of pull up side configured with P-channel output MOSFETs 200-222, as described above. In short, the output buffers have output functions equivalent to CMOS output circuits.

The output buffers 1 of pull-down side and the output prebuffers 3 that drive them have the same configuration as the open drain output circuit configured with the N-channel output MOSFETs of the embodiment of FIG. 1. In the output buffers 2 of pull-up side, the output MOSFETs of FIG. 1 are replaced by P-channel MOSFETs, and as output prebuffers 4 that drive them, the same as the output buffers shown in FIG. 3 is used.

The output buffer of this embodiment comprises the output buffers 2 of pull-up side and the output buffers 1 of pull-down side, as described above. The output prebuffers shown in FIGS. 2 and 3 are respectively disposed correspondingly to them. In this embodiment, impedance of the output buffers of pull-down side is controlled by impedance control codes ICn0 and ICn1, and slew rate is coordinated by slew rate control codes SRn0<0:2>-SRn2<0:2>. Furthermore, impedance of the output buffers of pull-up side is controlled by impedance control codes ICp0 and ICp1, and slew rate is controlled by slew rate control codes SRp0<0:2>-SRp2<0:2>.

Also in this embodiment, even if the impedance codes ICn0 and ICn1 change, an impedance ratio is kept constant among subgroups of the N-channel MOSFETs 100, 110, and 120, subgroups of the output MOSFETs 101, 111, 121, and subgroups of the output MOSFETs 102, 112, and 122. Furthermore, even if the impedance codes ICp0 and ICp1 change, an impedance ratio is kept constant among subgroups of the P-channel MOSFETs 200, 210, and 220, subgroups of the output MOSFETs 201, 211, 221, and subgroups of the output MOSFETs 202, 212, and 222.

Also in the embodiment of FIG. 7, impedance control and slew rate control can be performed independently of each other, and the configuration of a control circuit can be simplified. Moreover, as MOSFETs for impedance control, and MOSFETs for slew rate control, common output MOSFETs are used, so that pin capacity can be reduced in comparison with the case where different buffers are respectively disposed for the two types of MOSFETs. Even if environmental conditions such as temperature, voltage, and the like change and a combination of output MOSFETs for setting impedance to a setting value changes, slew rate can be kept constant as long as impedance is constant.

Figure 8:
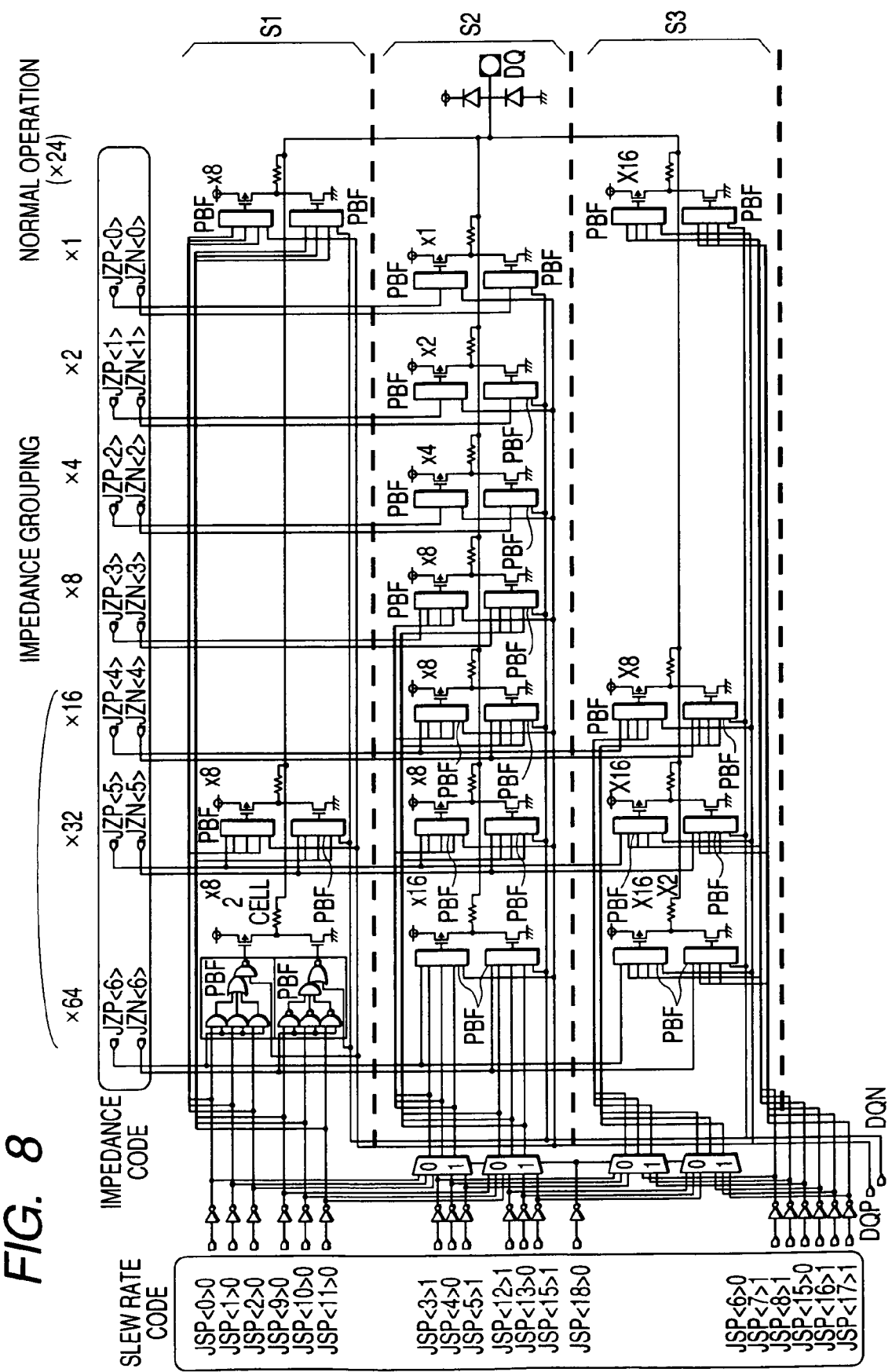
FIG. 8 is a schematic circuit diagram showing another embodiment of the output buffers provided in the semiconductor integrated circuit according to the present invention.

FIG. 8 is a schematic circuit diagram showing another embodiment of the output buffers provided in the semiconductor integrated circuit according to the present invention. In the figure, DQP designates a pull-up side data input, DQN designates a pull-down side data input, and DQ designates a data output terminal. Impedance control is performed by selecting an appropriate combination from a ×1-to-×64 impedance category by impedance control code JZN<0:6> for selecting N-channel output MOSFETs of pull-down side and JZP<0:6> for selecting P-channel output MOSFETs of pull-up side.

In this embodiment, to apply the present invention to the part of ×16-to-×64 output MOSFETs to control slew rate, the part of the output MOSFETs is divided into subgroups S1-S3. Subgroup S1 is a first output MOSFET group performing switching, subgroup S2 is an output MOSFET group performing switching Δt1 time after the output MOSFETs of subgroup S1 are turned on, and subgroup S3 is an output MOSFET MOS group performing switching Δt2 time after the output MOSFETs of subgroup S2 are turned on.

In this embodiment, the output buffers are configured with output MOSFETs and resistance elements connected in series with them and the values of on-state resistance of the MOSFETs and the resistance values of the resistance elements are made constant. Therefore, since voltage (Vds) applied to source/drain ends of the output MOSFETs is constant regardless of the divided buffer size, an impedance ratio is the same even if output voltage changes. Therefore, in any output voltage, an impedance ratio can be made constant regardless of setting values.

Impedance of the output MOSFETs is controlled by the respective 7-bit control signals JZP<0:6> and JZN<0:6> of the pull-up side and the pull-down side. Slew rate is controlled by changing W size (channel width) of MOSFETs forming a drive signal supplied to gates of the output MOSFETs by a control signal JSR<0:18>. Therefore, impedance control and slew rate control can be performed independently of each other, and the configuration of a control circuit can be simplified. Moreover, as MOSFETs for impedance control, and MOSFETs for slew rate control, common output MOSFETs are used, so that pin capacity can be reduced in comparison with the case where output buffers (output MOSFETs) are disposed individually.

Even if impedance control code JZN<0:6> and JZP<0:6> change due to changes in environments such as temperature and voltage, slew rate is kept constant by classifying MOS so as not to change a size ratio of MOSFETs (S1-S3) subjected to slew rate control.

In this embodiment, as buffers always operating, ×8 output MOSFETs and output prebuffers PBF driving them are provided for the subgroup S1, and ×16 output MOSFETs and output prebuffers PBF driving them are provided for the subgroup S3, so that ×24 output buffers in total are formed. With this construction, a maximum value of output impedance of the output buffers of this embodiment is set. Specifically, even if both impedance control codes JZN<0:6> and JZP<0:6> are 0, since the above-mentioned output buffers always operating operate, high-level and low-level output signals can be formed based on the maximum output impedance.

Figure 9:
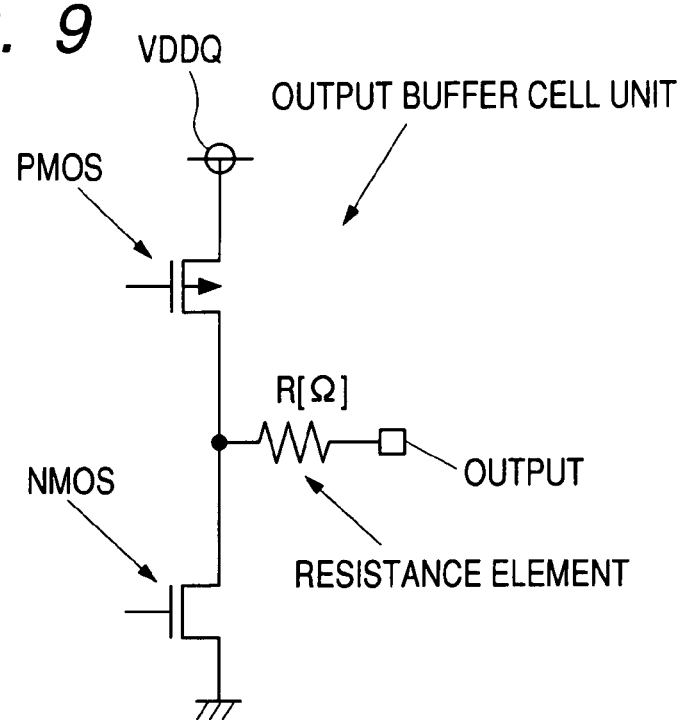
FIG. 9 is a circuit diagram showing one embodiment of a structure unit of output buffers according to the present invention.

FIG. 9 is a circuit diagram showing one embodiment of a structure unit of output buffer. An output buffer of a structure unit comprises an output MOSFET and a resistance element R connected in series with it. The ratio of an on-state resistance value of P-channel MOSFET (hereinafter referred to as PMOS) to a resistance value of the resistance element R is equal to the ratio of an on-state resistance value of N-channel MOSFET (hereinafter referred to as NMOS) to a resistance value of the resistance element R, which is set to about 1:1. The linearity of output impedance as output buffer is improved in comparison with the case where output buffer is configured with only PMOS and NMOS. When configured with only PMOS and NMOS, although on-state resistance values change with voltage between the source and drain due to the voltage dependence, it is lessened by connecting the resistance element R in series.

Figure 10:
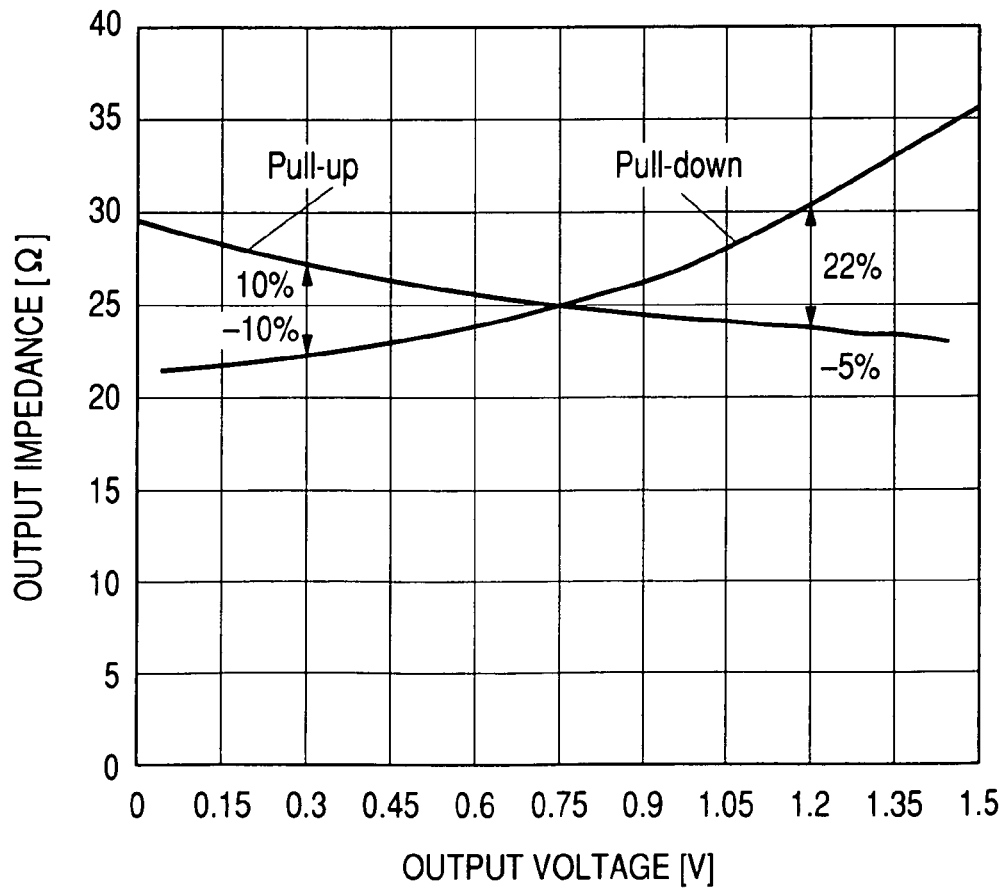
FIG. 10 is a characteristic diagram showing a result of analyzing the output voltage characteristics of impedance of the output buffers shown in FIG. 9 by circuit simulation.

FIG. 10 is a characteristic diagram showing a result of analyzing the output voltage characteristics of impedance of the output buffers shown in FIG. 9 by circuit simulation. It will be seen from the characteristic diagram that in the case where the power voltage VDDQ of FIG. 9 is 1.5 V and output amplitude is 1.5 V, when output impedance is adjusted to 25 ohms for an output voltage of 0.75 V (=0.5×VDDQ), a change of the output voltage to 0.3 V causes a change as small as −10 to +10%, and a change of the output voltage to 1.2 V causes a change as small as −5 to +22%.

Figure 11:
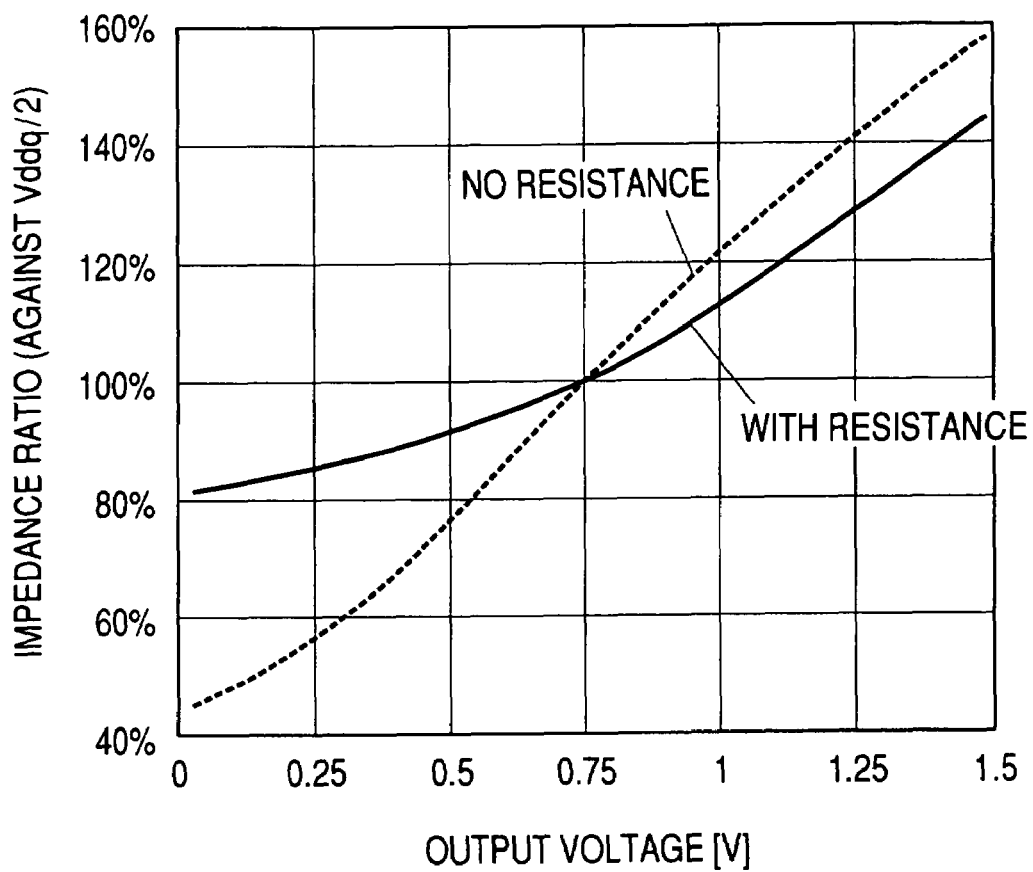
FIG. 11 is a characteristic diagram showing a result of analyzing the output voltage characteristics of impedance of the output buffers shown in FIG. 9 by circuit simulation.

FIG. 11 is a characteristic diagram showing a result of analyzing the output voltage characteristics of impedance of the output buffers shown in FIG. 9 by circuit simulation. The characteristic diagram shows output voltage characteristic comparison of output buffer impedance (pull-up side) between the existence and absence of resistance element. This characteristic diagram shows output voltage dependence of output impedance when output impedance is adjusted to 50 ohms for an output voltage of 0.75 V (=0.5×VDDQ) in the case where the power voltage VDDQ of FIG. 9 is 1.5 V and output amplitude is 1.5 V. It will be seen from the diagram that when an output buffer is configured with output MOSFETs and a resistance element, the linearity of impedance of the output buffer can be improved in comparison with the case where there is no resistance element.

Figure 12:
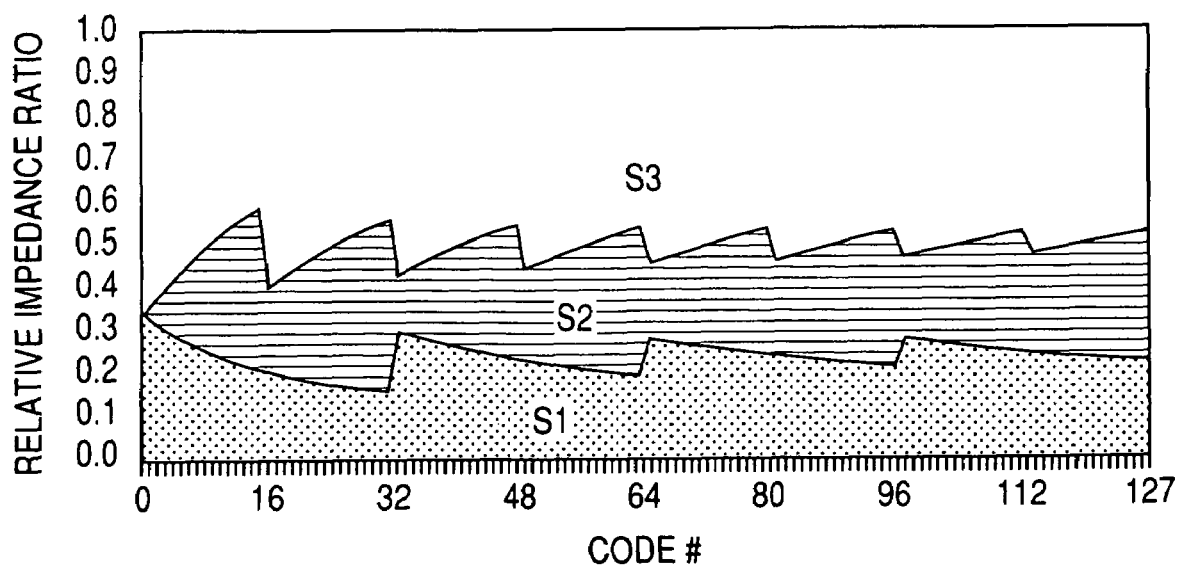
FIG. 12 is a characteristic diagram of impedance division ratios among divided subgroups for each impedance code # of the embodiment of FIG. 8.

FIG. 12 shows a characteristic diagram of impedance division ratios among divided subgroups for each impedance code # of the embodiment of FIG. 8. In the embodiment of FIG. 8, buffers for slew rate control are divided into subgroups at almost the same size ratio among buffers (×16 to ×64) divided for impedance control. Therefore, as shown in the characteristic diagram of the figure, for any impedance codes #, impedance ratios among buffer groups (subgroups S1, S2, and S3) successively turned on in the whole output buffers is kept almost constant. Accordingly, even if combinations of output MOSFETs change, slew rate can be kept constant. As a result, even if environmental conditions such as temperature, voltage, and the like change and combinations of output MOSFETs for setting impedance to a setting value change, slew rate can be kept constant as long as impedance is constant.

Figure 13:
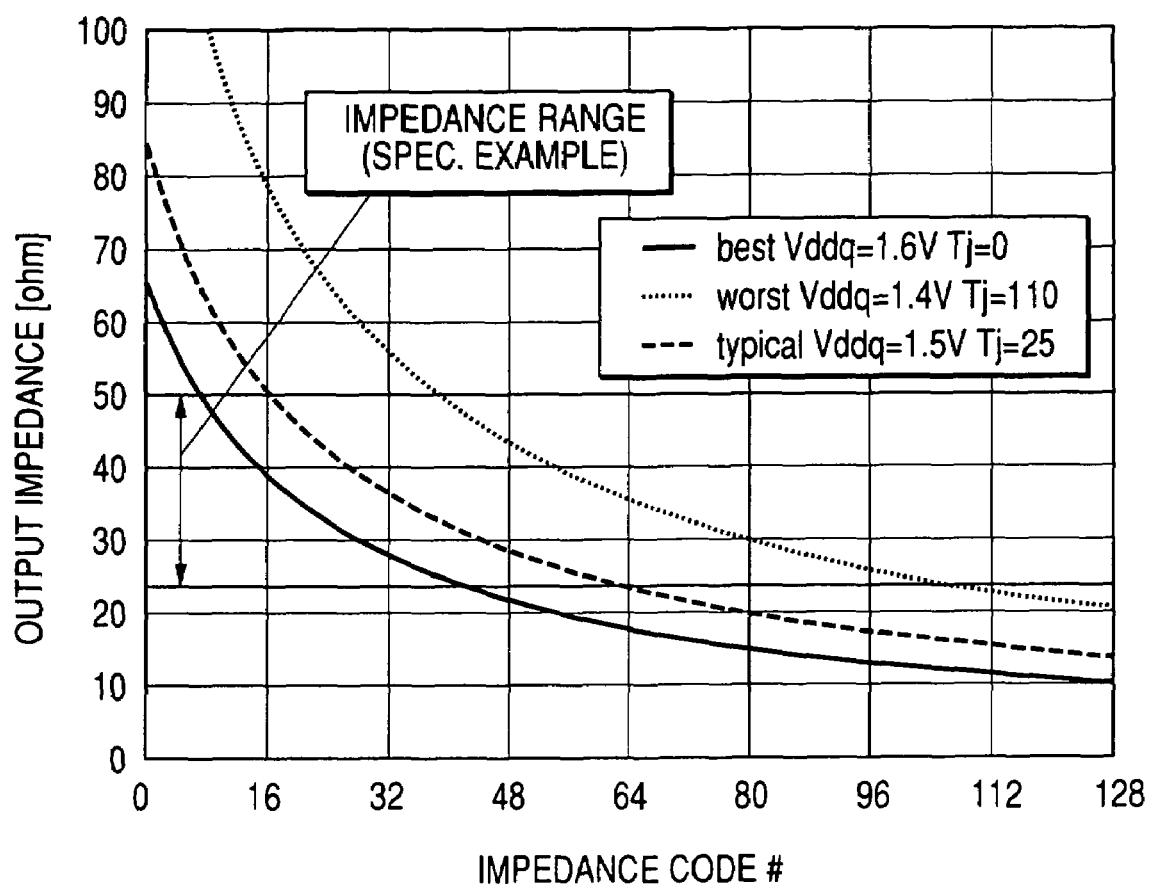
FIG. 13 is a characteristic diagram showing a result of analyzing the relationship between impedance codes of the embodiment of FIG. 8.

FIG. 13 is a characteristic diagram showing a result of analyzing the relationship between impedance codes of the embodiment of FIG. 8 and output impedances by circuit simulation. It will be seen from the characteristic diagram that even if the characteristics of device are variable (best, worst, typical in the figure), or environmental conditions (temperature Tj, voltage Vddq) change, by controlling impedance codes #, output impedance can be set within a range of specification, e.g., 50 to 23 ohms.

Figure 14:
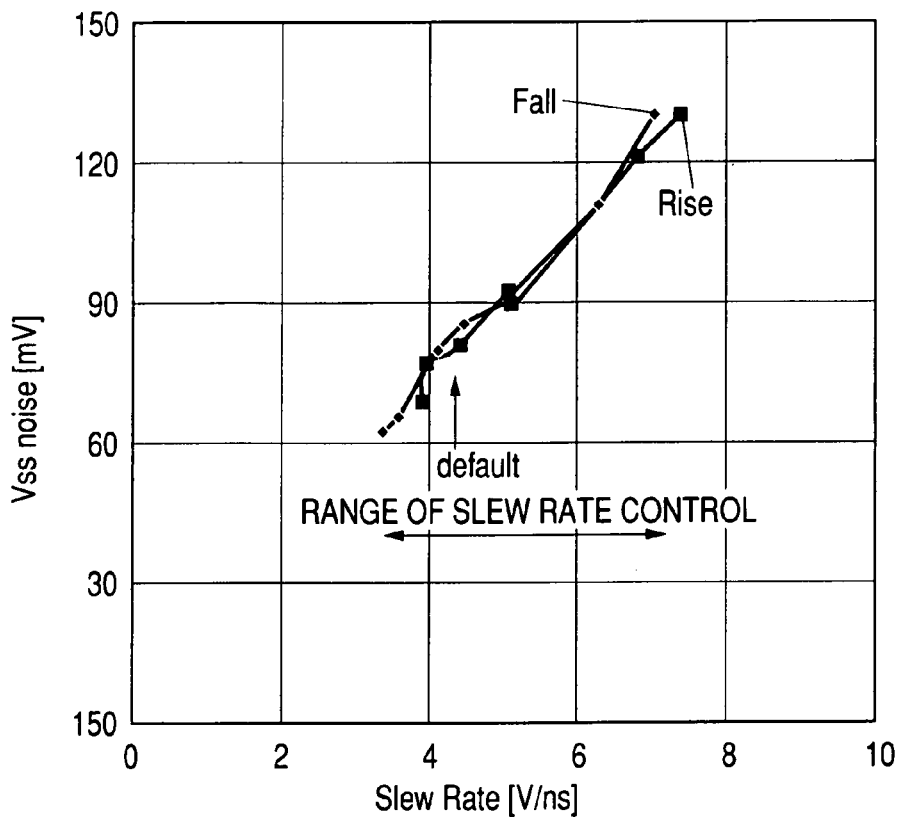
FIG. 14 is a characteristic diagram showing a result of analyzing the relationship between slew rates and SRAM power noises by circuit simulation.
Figure 15:
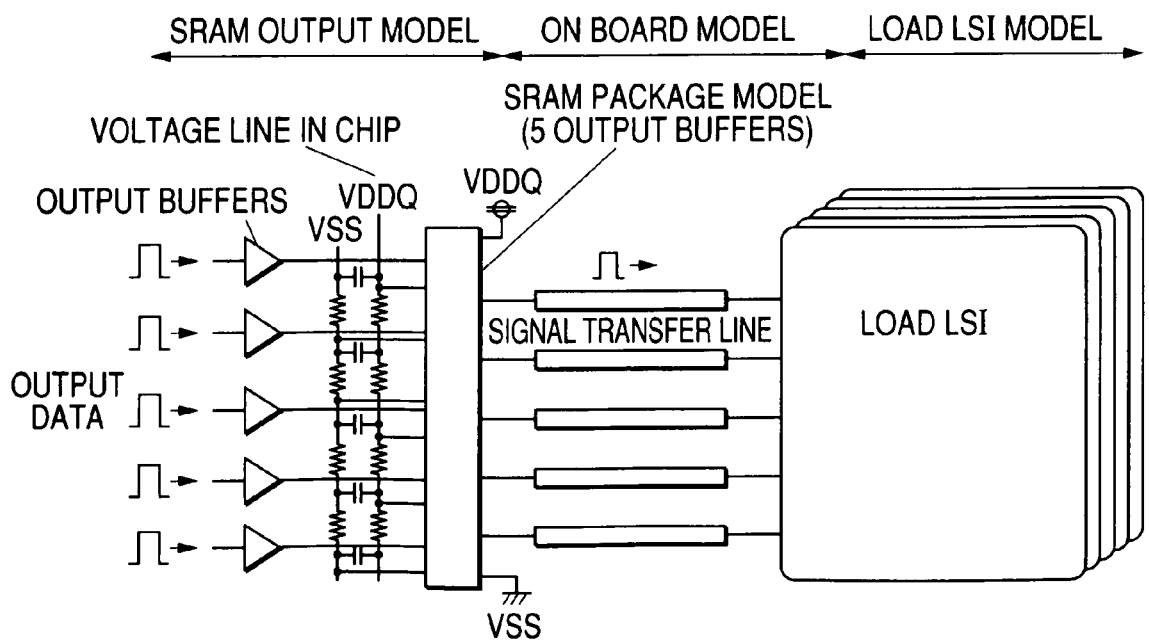
FIG. 15 is a block diagram showing an evaluation mode used for the circuit simulation of FIG. 14.

FIG. 14 is a characteristic diagram showing a result of analyzing the relationship between slew rates and SRAM (static random access memory) power noises by circuit simulation by use of an evaluation model of FIG. 15. The horizontal axis of FIG. 14 represents slew rates of output data inputted to SRAM output buffers of the evaluation model shown in FIG. 15, and the vertical axis represents power noise amounts (Vss noise) induced in power VSS within SRAM. It will be seen from the characteristic diagram that control of slew rates is very effective to reduce the occurrence of noise. In other words, by decreasing slew rates or smoothing the rising edge of output data inputted to output buffers, power noise amounts (Vss noise) can be reduced.

FIG. 16 shows a structure diagram of one embodiment of output buffer cell. FIG. 16A shows a layout structure and FIG. 16B shows an equivalent circuit corresponding to it. In this embodiment, as a basic structure, an output pin (PAD) is connected through one straight wiring with ESD (electrostatic breakdown) protection diodes ($p^+$ diode, $n^+$ diode), resistance element, NMOS, and PMOS disposed in that order. As many output buffers of the basic structures as required for impedance control and slew rate control are disposed in parallel in a stripe form in a direction orthogonal to the straight wiring, whereby one output buffer can be formed.

Figure 17:
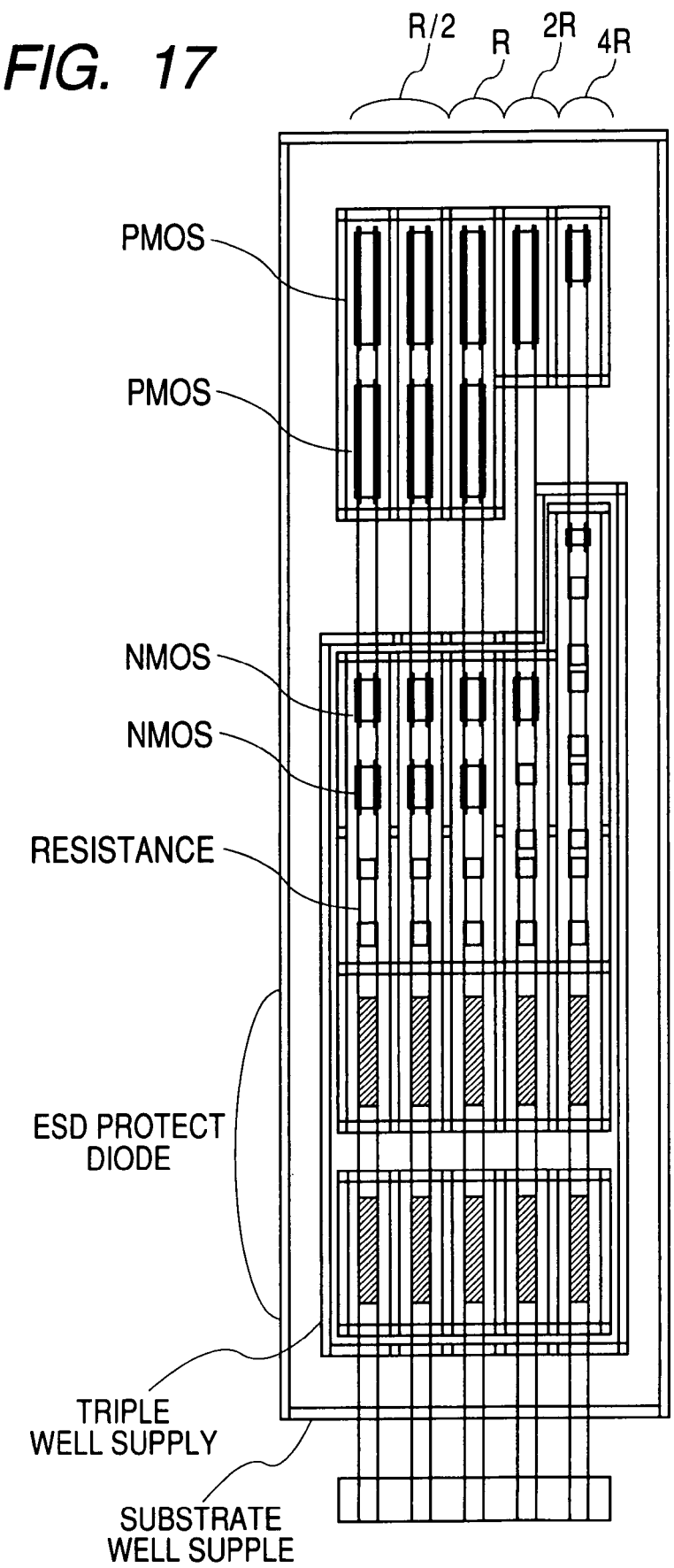
FIG. 17 is a layout showing one embodiment of output buffer according to the present invention.

FIG. 17 is a layout showing one embodiment of output buffer according to the present invention. In this embodiment, by selecting output buffer cells (R/2, R, 2R, 4R) geometrically divided by binary impedance codes, impedance is controlled. For stripe units (R/2, R) of smaller impedances, the size (W) of MOSFET is increased and resistance size is reduced. On the other hand, for stripe units (2R, 4R) of higher impedances, MOSFET size is reduced and resistance size is increased.

Specifically, since on-state resistance value of MOSFET is inversely proportional to gate size (W) and a resistance value of resistance element is proportional to layout size, the ratio between on-state resistance values of output buffers and the resistance values of resistance elements are set to be the same and the shape of cell layout is adjusted, whereby impedance is changed without changing cell height (the length of the above-mentioned wiring direction). Accordingly, even if the height of stripe unit cells is set the same among impedance division cells, since no useless spaces are produced, a high degree of integration can be achieved.

Figure 18:
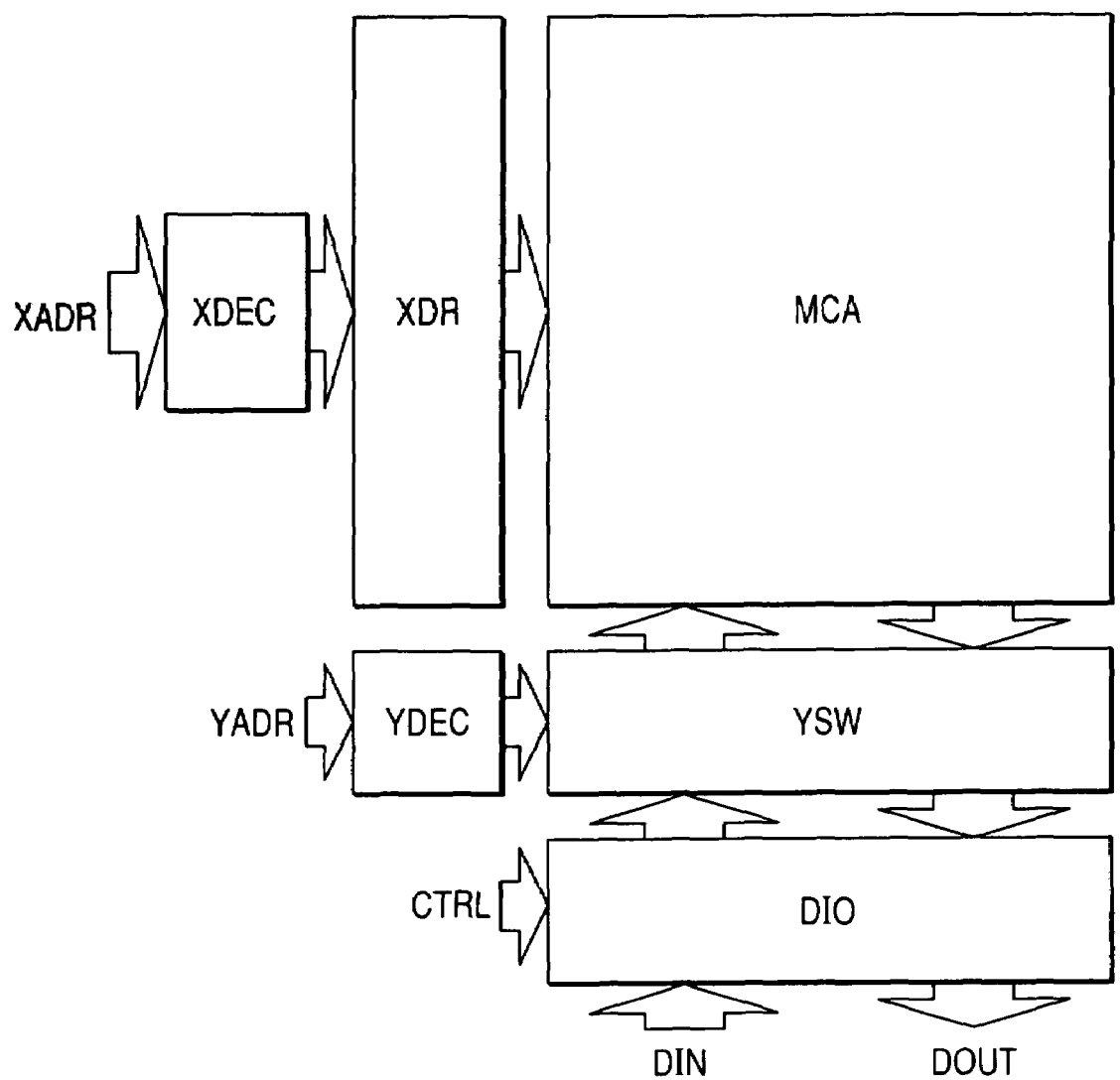
FIG. 18 is a block diagram showing one embodiment of semiconductor memory to which the present invention is applied.

FIG. 18 is a block diagram showing one embodiment of semiconductor memory to which the present invention is applied. In the figure, XADR designates a row address signals YADR designates a column address signal, DIN designates a data input signal, CTRL designates a memory control signal, and DOUT designates a data output signal. XDEC designates a row address decoders XDR designates a word line driver that applies selection pulse voltage to a word line corresponding to a row address, and MCA designates a memory cell array in which plural memory cells are disposed in matrix. YDEC designates a column address decoder, YSW designates a column selection circuit that selects a bit line pair corresponding to a column address, and DIO designates a data input/output circuit that writes a data input signal DIN to a selected cell, based on a memory control signal CTRL, or amplifies information of a selected cell and outputs a data output signal DOUT. The above-mentioned output buffer is contained in the data input/output circuit DIO.

Figure 19:
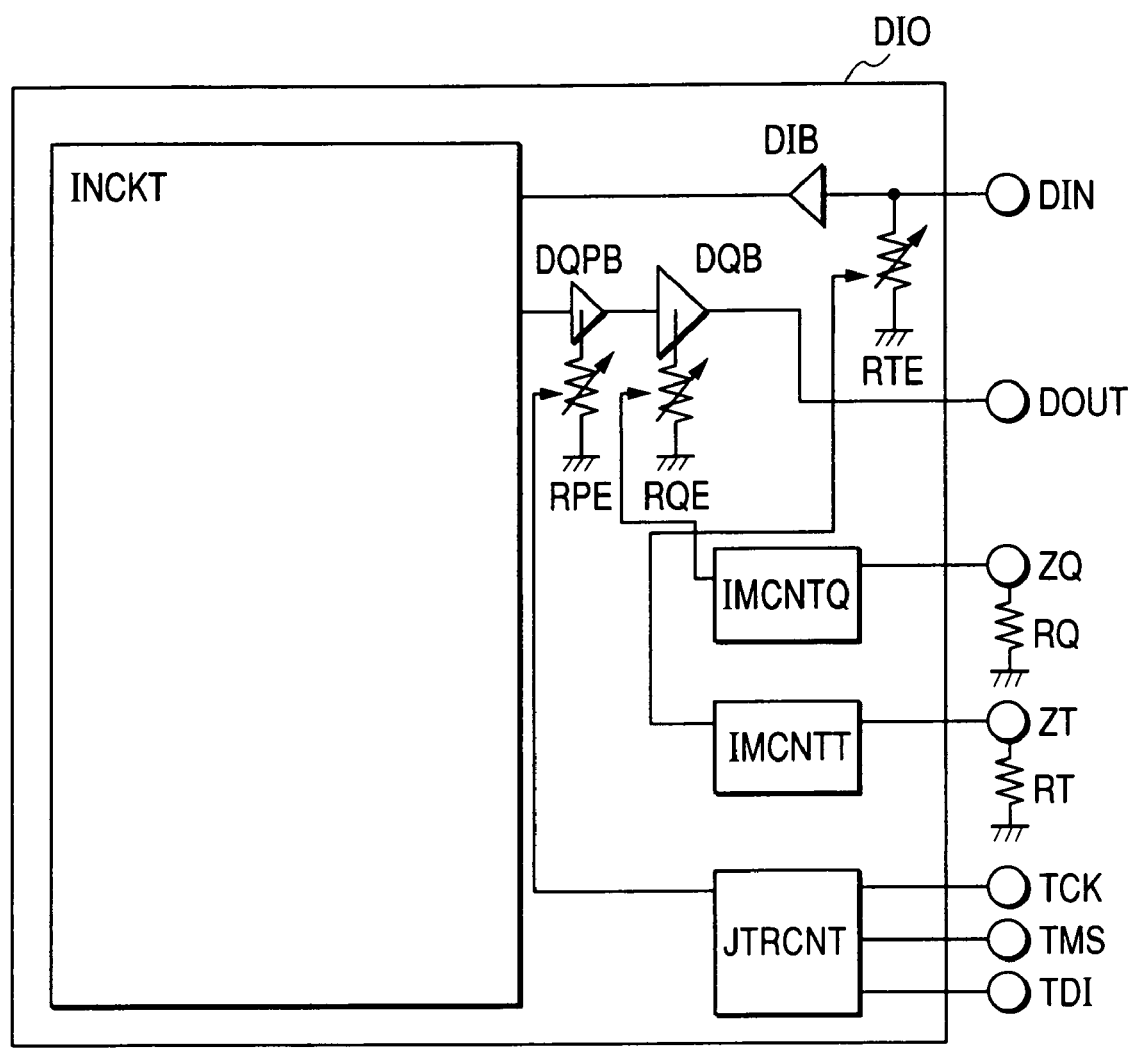
FIG. 19 is a block diagram showing one embodiment of a data input/output circuit DIO of the semiconductor memory of FIG. 18.

FIG. 19 is a block diagram showing one embodiment of a data input/output circuit DIO of the semiconductor memory of FIG. 18. In the figure, DIN designates a data input signal (input terminal) and DOUT designates a data output signal (output terminal). DIB designates an input buffer, DQB designates the output buffer, and DQPB designates the output prebuffer.

RTE designates resistance for controlling input impedance of a terminal for receiving data input signals. In this embodiment, an impedance control circuit IMCNTT adjusts an RTE resistance value, based on a value of resistance RT connected to a terminal ZT. RQE designates resistance for adjusting output impedance of an output terminal OUT that sends data output signals, and, for example, corresponds to impedance of the output buffer DQB in the above-mentioned embodiment. In this embodiment, an impedance control circuit IMCNTQ controls resistance of RQE, based on a value of resistance RQ connected to the terminal ZQ.

RPE designates resistance for controlling data output signal slew rate, and, for example, corresponds to impedance of the output prebuffers in the example. In this embodiment, a slew rate control circuit JTRCNT using JTAG (IEEE standard 1149.1 proposed by Joint Test Action Group) controls resistance of RPE, based on JTAG input signals (TCK, TMS, TDI). An internal circuit INCKT comprises a read amplifier (gain amplifier) for forming read data, a write amplifier for receiving write data, and a control circuit for controlling them.

In the semiconductor memory of this embodiment, output impedance of the output buffer DQB is set by the above-mentioned outer resistance RQ, and the input terminal includes a terminal resistance RTE in which a resistance value is set correspondingly to outer resistance RT. Accordingly, in a system including the semiconductor memory and a processor and the like connected through transmission lines on a mounting board, by connecting the outer resistances RQ and RT having resistance values corresponding to the characteristic impedances of the transmission lines, the output impedance of the output buffer can be matched to the transmission lines, and the characteristic impedances of the terminal resistance RTE connected with the input terminal DIN and the transmission lines can be matched.

Therefore, during reading from the semiconductor memory by the processor or the like, when a read signal is conveyed to the processor or the like through a transmission line connected to the output terminal DOUT, reflection noise that would occur in a system in which a terminal resistance is not connected to a input circuit such as the processor can be absorbed by the output impedance RQE of the output buffer. Moreover, since re-reflection noise is not conveyed to the processor side, rapid reading is enabled. Even if a terminal resistance is disposed in an input circuit such as the processor, since noise that would occur when the impedance matching is imperfect can be absorbed by the output impedance RQE of the output buffer, rapid and stable data transfer can be achieved.

When writing to the semiconductor memory is performed by the processor or the like, since the terminal resistance RTE connected to the input terminal DIN is matched to the characteristic impedance of the transmission line, rapid writing is enabled. In other words, in the system, without connecting an external terminal resistance to the external terminal, a high-speed data transfer is enabled and an easy-to-use semiconductor memory can be realized. The terminal resistance RTE built into the semiconductor integrated circuit and the impedance control circuit IMCNTT will be described in detail.

Figure 20:
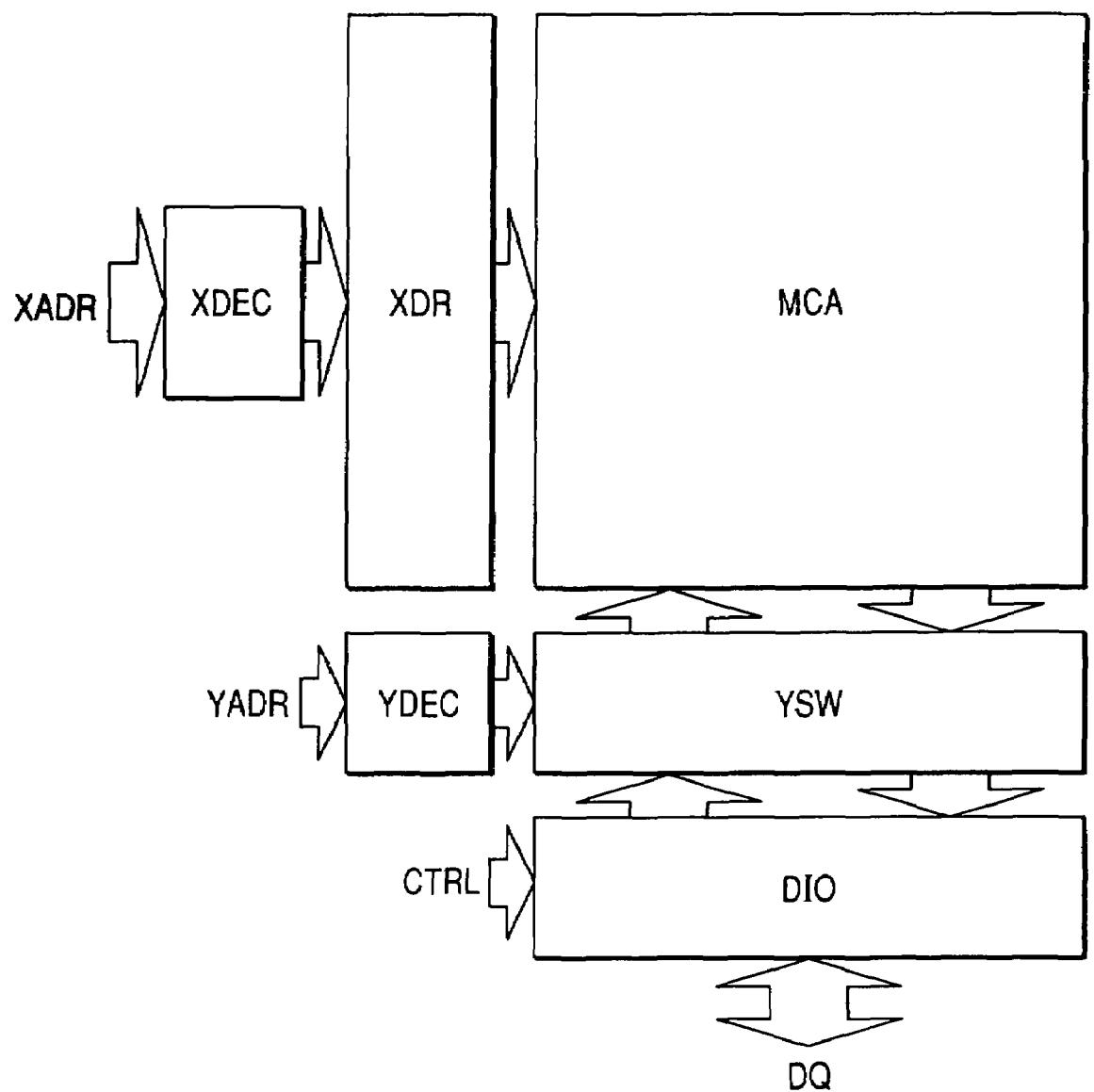
FIG. 20 is a block diagram showing another embodiment of the semiconductor memory to which the present invention is applied.

FIG. 20 shows a block diagram of another embodiment of the semiconductor memory to which the present invention is applied. In this embodiment, like the embodiment of FIG. 18, XADR designates a row address signal, YADR designates a column address signal, CTRL designates a memory control signal, and DQ designates a data input/output signal. This embodiment is different from the embodiment of FIG. 18 in that, in the embodiment of FIG. 18, the data input terminal DIN and the data output terminal DOUT are separated from each other, while, in this embodiment, the terminals are shared as a data input/output terminal DQ.

In this embodiment, XDEC designates a row address decoders XDR designates a word line driver that applies selection pulse voltage to word line corresponding to a row address, and MCA designates a memory cell array in which plural memory cells are disposed in matrix. YDEC designates a column address decoder, YSW designates a column selection circuit that selects a bit line pair corresponding to a column address, and DIO designates a data input/output circuit that writes a data input/output signal DQ to a selected cell, based on a memory control signal CTRL, or amplifies information of a selected cell and outputs a data input/output signal DQ. The above-mentioned output buffer is contained in the data input/output circuit DIO.

Figure 21:
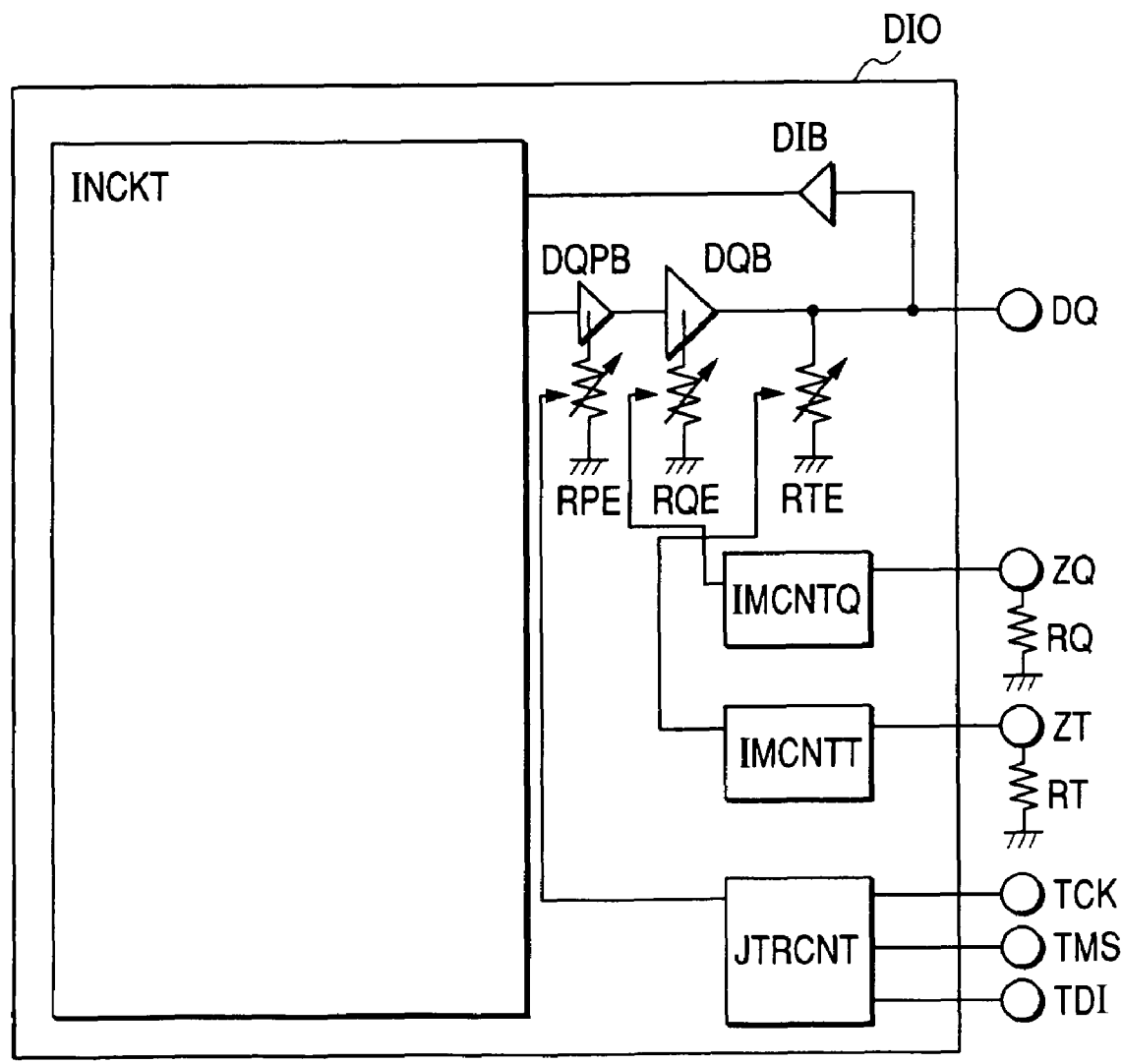
FIG. 21 is a block diagram showing one embodiment of a portion relating to the present invention of the data input/output circuit DIO of the semiconductor memory of FIG. 20.

FIG. 21 is a block diagram showing one embodiment of a portion relating to the present invention of the data input/output circuit DIO of the semiconductor memory of FIG. 20. In the figure, DQ designates a data input/output signal (terminal). DIB designates a data input buffer, DQB designates a data output buffer, and DQPB designates a data output prebuffer.

Like the embodiment of FIG. 19, RTE designates resistance for controlling input impedance of a terminal for sending and receiving data input/output signals. In this embodiment, an impedance control circuit IMCNTT adjusts an RTE resistance value, based on a value of resistance RT connected to a terminal ZT. RQE designates resistance for adjusting output impedance of a terminal OUT that sends and receives data input/output signals, and, for example, corresponds to impedance of the output buffer in the above-mentioned embodiment. In this embodiment, the impedance control circuit IMCNTQ controls resistance of RQE, based on a value of resistance RQ connected to the terminal ZQ.

RPE designates resistance for controlling data output signal slew rate, and, for example, corresponds to impedance of the output prebuffers in the above-mentioned embodiment. In this embodiment, a slew rate control circuit JTRCNT using JTAG (IEEE standard 1149.1 proposed by Joint Test Action Group) controls resistance of RPE, based on JTAG input signals (TCK, TMS, TDI). Also in this embodiment, when reading from or writing to the semiconductor memory is performed by the processor or the like, like the foregoing, in the system, without connecting an external terminal resistance to the external terminal, a high-speed data transfer is enabled and an easy-to-use semiconductor memory can be realized.

Figure 22:
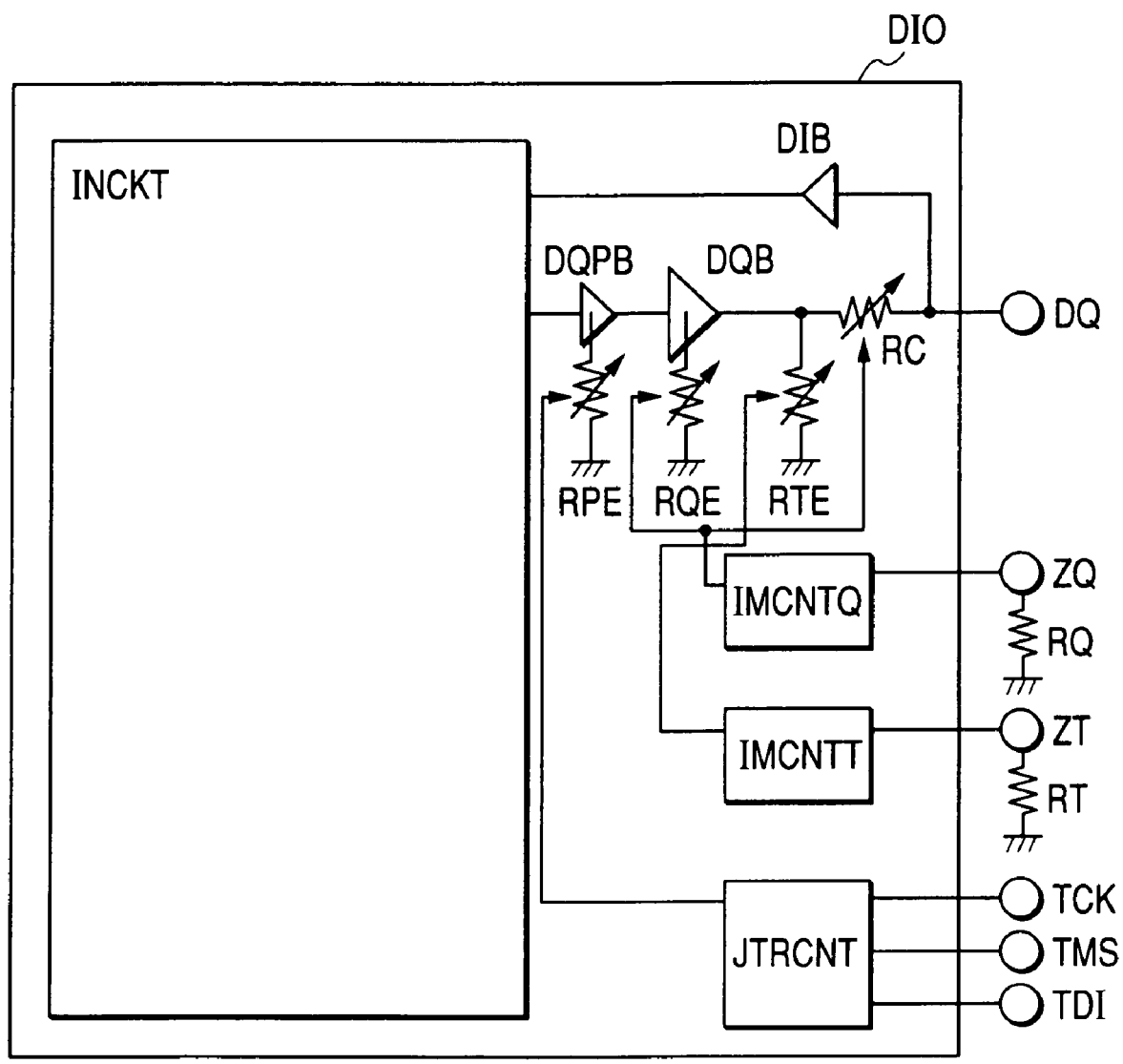
FIG. 22 is a block diagram showing another embodiment of a portion relating to the present invention of the data input/output circuit DIO of the semiconductor memory of FIG. 20.

FIG. 22 is a block diagram showing another embodiment of a portion relating to the present invention of the data input/output circuit DIO of the semiconductor memory of FIG. 20. In this embodiment, like the foregoing, DQ designates a data input/output signal. DIB designates a data input buffer, DQB designates a data output buffer, and DQPB designates a data output prebuffer.

Like the embodiment of FIG. 21, RTE designates resistance for controlling input impedance of a terminal for sending and receiving data input/output signals. In this embodiment, an impedance control circuit IMCNTT adjusts an RTE resistance value, based on a value of resistance RT connected to a terminal ZT. RQE designates resistance for adjusting output impedance of a terminal OUT that sends and receives data input/output signals, and, for example, corresponds to impedance of the output buffer in the above-mentioned embodiment. In this embodiment, the impedance control circuit IMCNTQ controls resistance of RQE, based on a value of resistance RQ connected to the terminal ZQ.

In this embodiment, furthermore, resistance RC is added and controlled by an impedance control circuit IMCNTQ. Since the resistance RC operates both during data input and during data output, it can be used commonly for control of input impedance and control of output impedance. Such a common use of the RC has the effect of reducing a layout area of the input/output circuit.

Like the foregoing, RPE designates resistance for controlling data output signal slew rate, and, for example, corresponds to impedance of the output prebuffers in the above-mentioned embodiment. In this embodiment, a slew rate control circuit JTRCNT using JTAG controls resistance of RPE, based on JTAG input signals (TCK, TMS, TDI).

Figure 23:
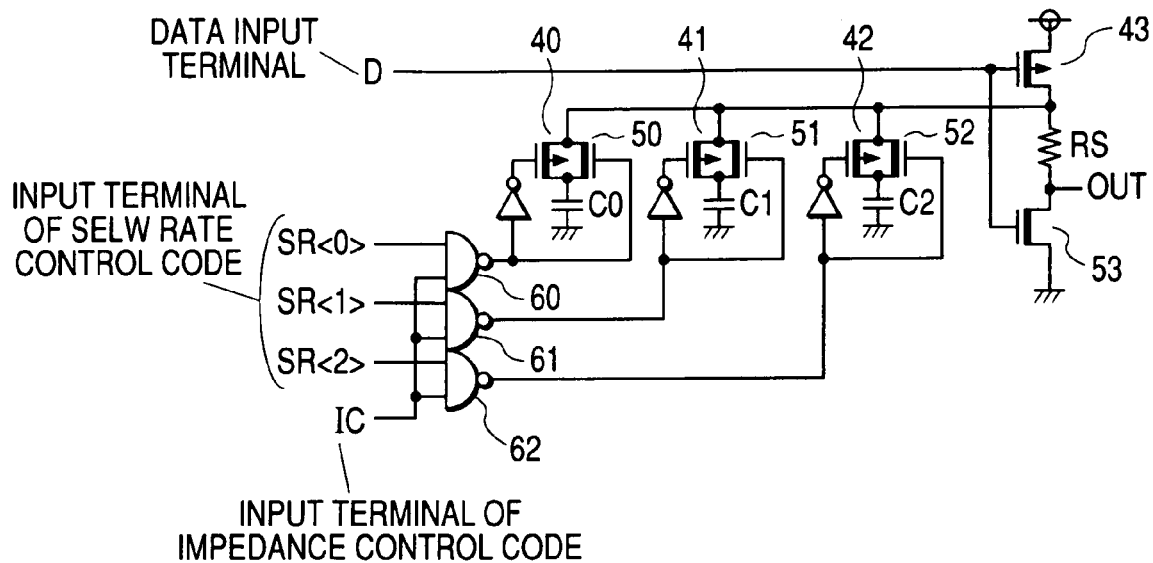
FIG. 23 is a circuit diagram showing another embodiment of the output prebuffer circuit according to the present invention.

FIG. 23 shows a circuit diagram of another embodiment of the output prebuffer circuit. In this embodiment, a variant of the output prebuffers of FIG. 2 is described. In this embodiment, D designates a data input terminal, and OUT designates an output terminal which is connected to an output buffer. IC designates an impedance control code input terminal, and SR<0>, SR<1>, and SR<2> respectively designate slew rate control code input terminals.

The output prebuffers of this embodiment are selected by the impedance control code IC. Therefore, in FIG. 7, one of the prebuffer groups 300-302, 310-312, and 320-322 is selected by ICn0 and ICn1 as an output prebuffer group to be brought into operation. As a result, one of the output buffer groups output MOSFETs 100-102, 110-112, and 120-122 can be selected as an output buffer group to be brought into operation.

By slew rate control code SR<0:2>, a combination of PMOSs and NMOSs to be turned on is selected from among CMOS switches comprising PMOSs 40-42 and NMOSs 50-52, and a combination of condensers connected to a drain node of PMOS 43 is selected from C0 and C1. In this way, a time constant of the drain node of PMOS 43 is changed. In short, a larger capacitance value delays the rise of the output terminal. OUT, decreasing slew rate in the output MOSFETs to be driven.

Figure 24:
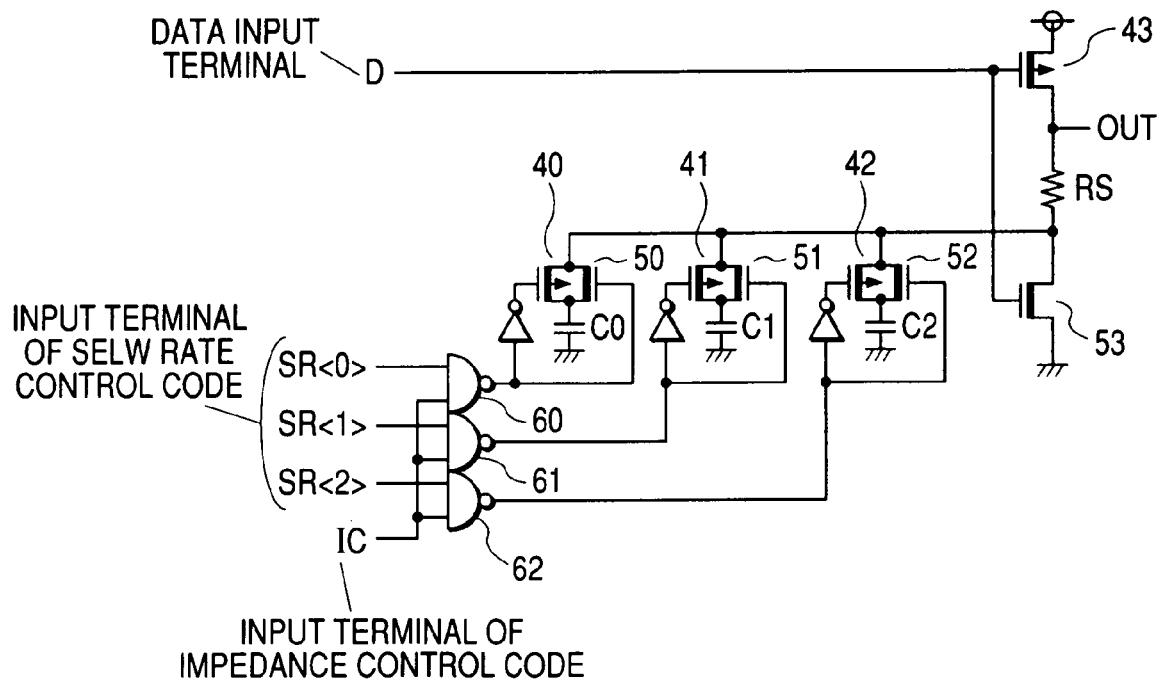
FIG. 24 is a circuit diagram showing another embodiment of the output prebuffer circuit according to the present invention.

FIG. 24 is a circuit diagram showing another embodiment of the output prebuffer circuit. In this embodiment, a variant of the output prebuffers of FIG. 3 is described. In this embodiment, D designates a data input terminal, and OUT designates an output terminal which is connected to an output buffer. IC designates an impedance control code input terminal, and SR<0>, SR<1>, and SR<2> respectively designate slew rate control code input terminals.

The output prebuffers of this embodiment are selected by the impedance control code IC. Therefore, in FIG. 7, one of the prebuffer groups 400-402, 410-412, and 420-422 is selected by ICn0 and ICn1 as an output prebuffer group to be brought into operation. As a result, one of the output buffer groups output MOSFETs 200-202, 210-212, and 220-222 can be selected as an output buffer group to be brought into operation.

By the slew rate control code SR<0:2>, a combination of PMOS and NMOS to be turned on is selected from among CMOS switches comprising PMOSs 40-42 and NMOSs 50-52, and a combination of condensers connected to a drain node of NMOS 53 is selected from C0 and C1. In this way, a time constant of the drain node of NMOS 43 is changed. A larger capacitance value delays the rise of the output terminal OUT, decreasing slew rate of the output MOSFETs to be driven.

Figure 25:
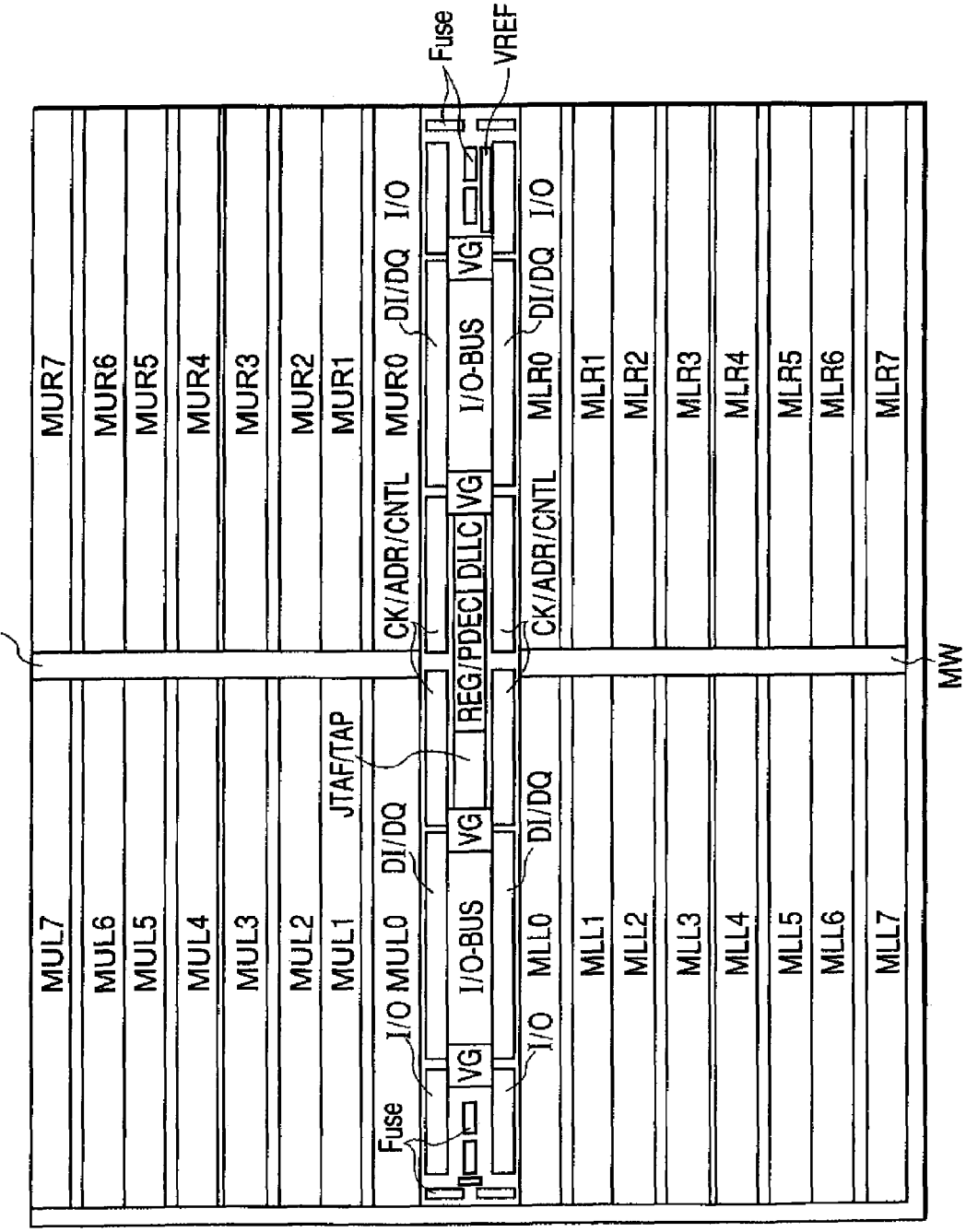
FIG. 25 is a chip layout diagram showing one embodiment of a semiconductor memory to which the present invention is applied.

FIG. 25 is a chip layout diagram showing one embodiment of a semiconductor memory to which the present invention is applied. In the figure, MUL0-MUL7, MUR0-MUR7, MLL0-MLL7, and MLR0-MLR7 are cell arrays in which memory cells are disposed like an array, and MWD designates a main word driver. CK/ADR/CNTL designates an input circuit for clock signal, address signal, and memory control signal. DI/DQ designates a data input/output circuit. I/O designates an input/output circuit for mode switching signal, test signal, and DC signal.

Since the semiconductor memory of this embodiment adopts the center pad system, the CK/ADR/CNTL circuit, the DI/DQ circuit, and the IO device are located at the center of a chip. REG/PDEC designates a pre-decoder and the like; DLLC, a clock synchronization circuit; JTAG/TAP, a test circuit; and VG, an internal voltage generator. Fuse designates a fuse circuit used for memory array redundancy. VREF generates reference voltage for capturing an input signal. The above-mentioned output buffers are disposed in the DI/DQ part.

Figure 26:
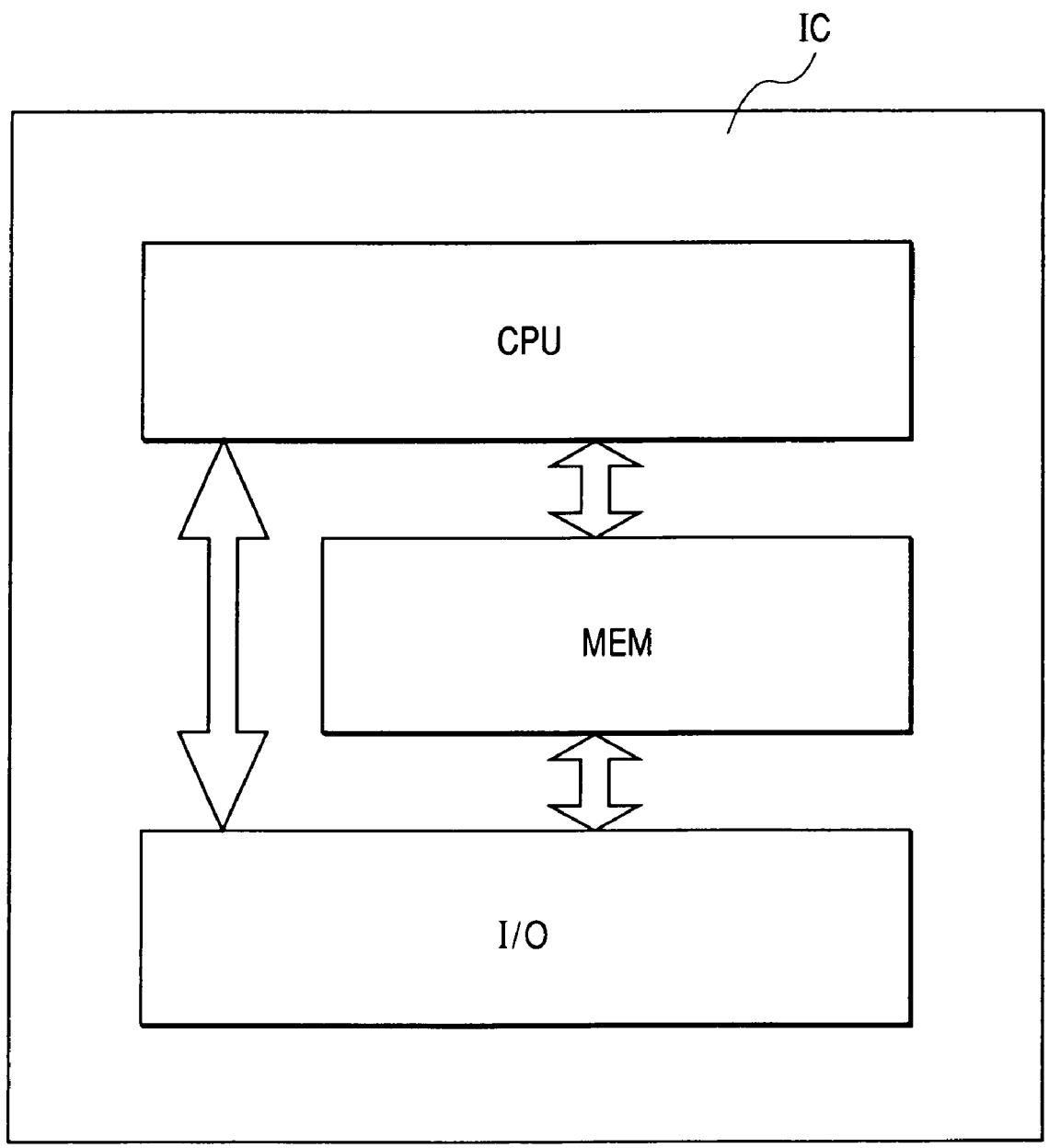
FIG. 26 is a chip layout diagram showing another embodiment of the semiconductor memory to which the present invention is applied.

FIG. 26 is a chip layout diagram showing another embodiment of the semiconductor memory to which the present invention is applied. In the figure, CPU designates a central processing unit; MEM, a memory; and I/O, an input/output circuit. The above-mentioned output buffer is applied to the I/O part. Thus, if the central processing unit CPU, the memory MEM, and the input/output circuit I/O to which the present invention is applied are formed on an identical semiconductor substrate, since the CPU can perform operations for given processing while rapidly exchanging data with the memory MEM and the input/output circuit I/O, total processing performance can be improved.

Figure 27:
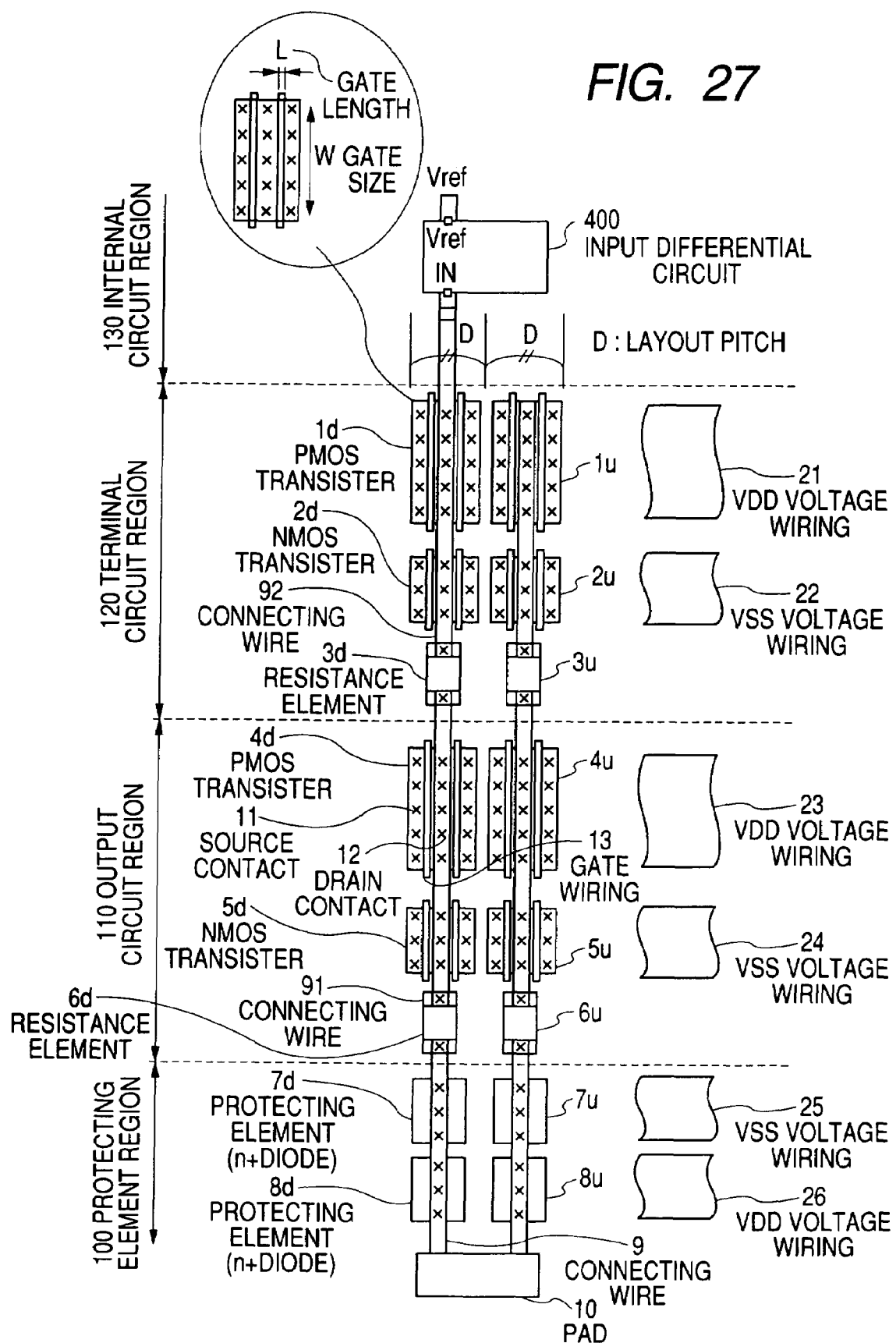
FIG. 27 is a layout showing one embodiment of an input/output circuit with an input terminal resistance in the semiconductor integrated circuit according to the present invention.
Figure 28:
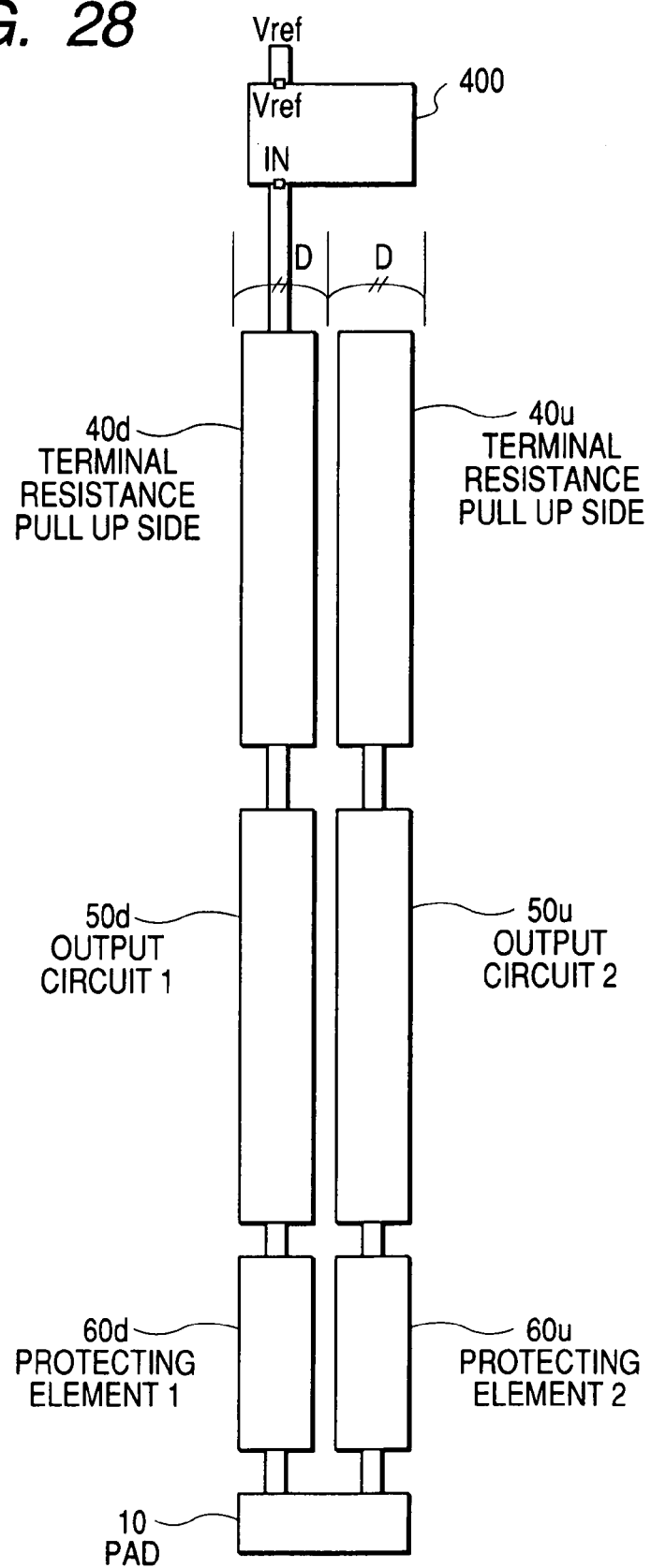
FIG. 28 is a layout showing a block structure of an input-output circuit of FIG. 27.
Figure 29:
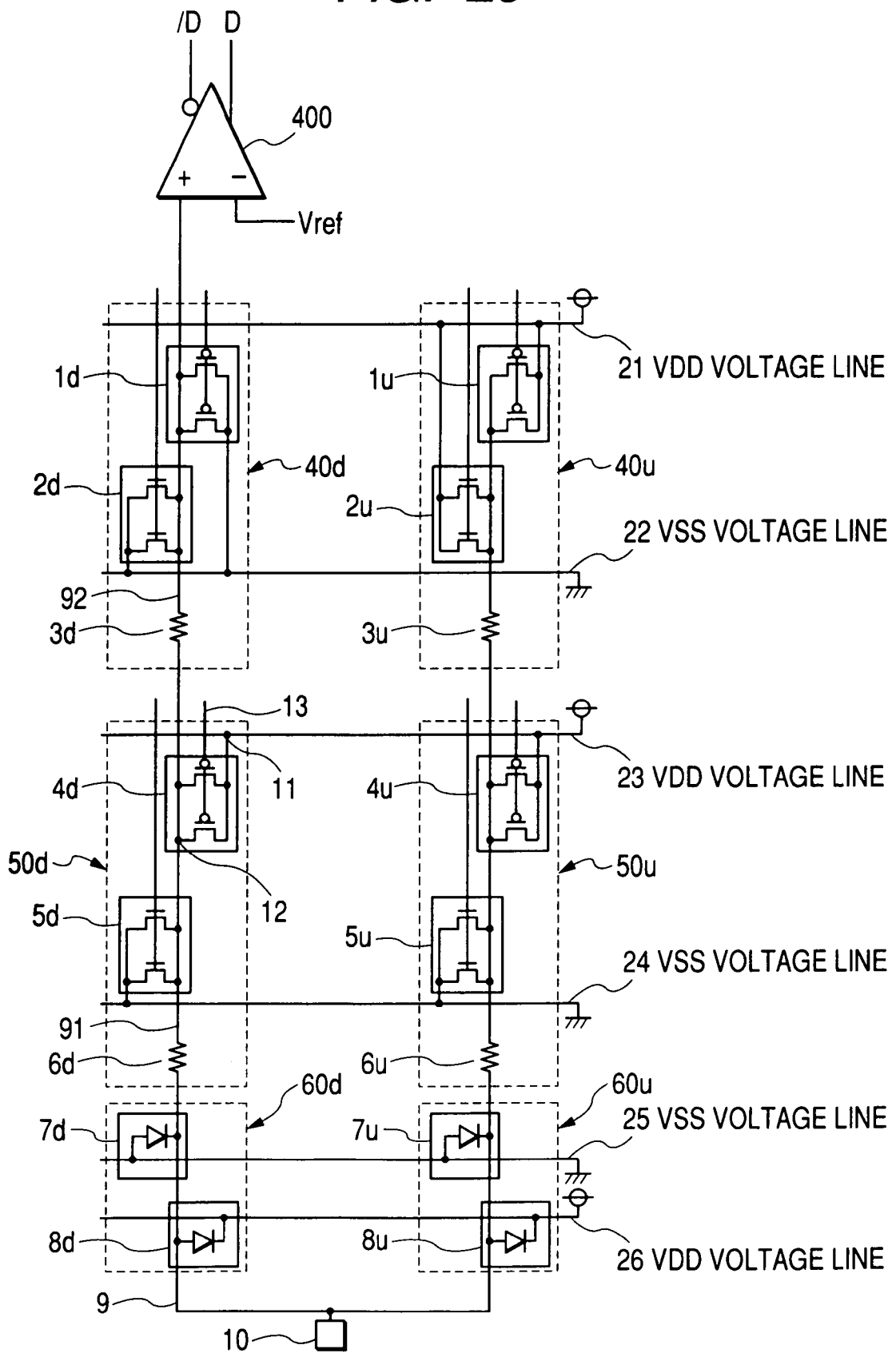
FIG. 29 is a diagram showing an equivalent circuit of the input/output circuit of FIG. 27.
Figure 30:
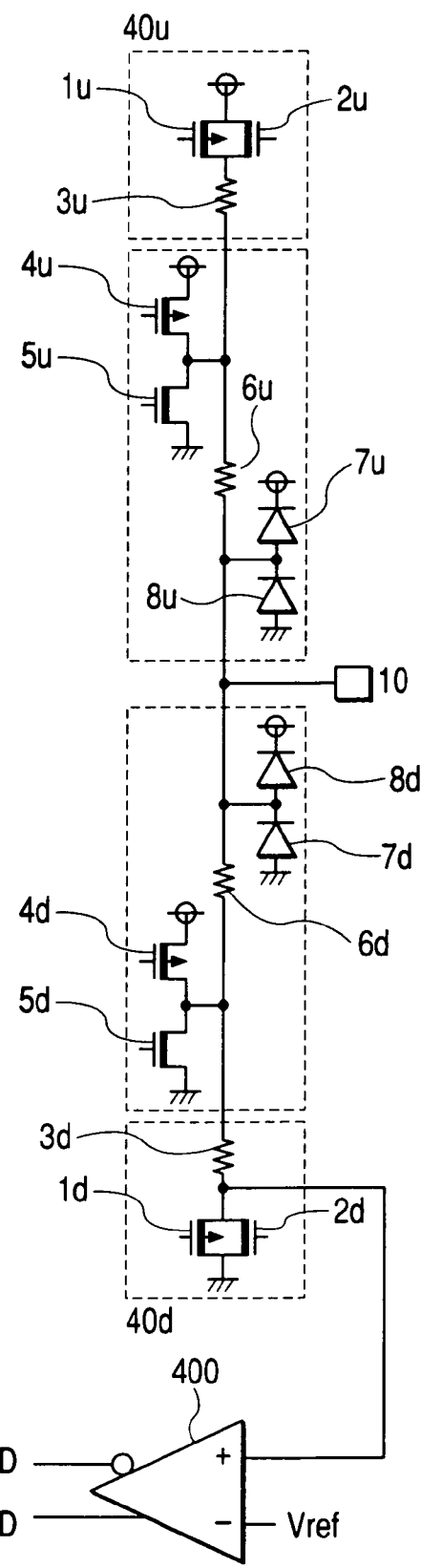
FIG. 30 is a circuit diagram showing an easy-to-understand deformation of the input/output circuit of FIG. 29.
Figure 30:
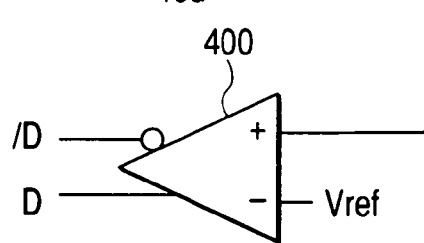

FIG. 27 is a layout showing one embodiment of an input/output circuit with an input terminal resistance in the semiconductor integrated circuit according to the present invention. FIG. 28 is a layout showing a block structure of the input-output circuit of FIG. 27. FIG. 29 shows an equivalent circuit of the circuit of FIG. 27. FIG. 30 is a circuit diagram showing an easy-to-understand deformation of the circuit of FIG. 29.

In FIG. 27, through connecting wirings 9, 91, and 92 from a signal pad 10, an ESD protecting element (7d, 8d), a resistance element 6d, an N-channel MOSFET 5d, a P-channel MOSFET 4d, a resistance element 3d, an N-channel MOSFET 2d, P-channel MOSFET 1d, and an input differential circuit 400 are connected in that order. The MOSFETs 4d and 5d, and the resistance element 6d in an output circuit region 110 make up an output buffer. The PMOS transistor 1d, the NMOS transistor 2d, and the resistance element 3d in a terminal resistance circuit region 120 make up an input terminal resistance. On an upper layer of the MOSFETs and the ESD protecting elements, power supply wirings 21-26 are placed in a horizontal direction of the figure. As shown in FIG. 29 or 30, the power supply wirings 21-26 are connected in contact with the source or anode/cathode terminal immediately above the elements.

When a terminal resistance is configured with Thevenin termination (CTT; Center Tapped Termination), a pair of input terminal resistances is configured using two unit circuits with one at pull-up side (connected to VDD) and the other at pull-down side (connected to VSS). A layout of the input terminal resistance and a layout of the output buffer are disposed at an equal layout pitch as shown by layout pitch D, and respectively disposed with different MOSFETs and resistances.

Thus, by placing elements making up a unit circuit on one straight line, a PAD wiring extending from a drain of an output buffer may be connected or disconnected, depending on whether an input terminal resistance is required or not. Therefore, redundant bypass wirings are not required. The resistance element 6d used in the output buffer can be shared with the terminal resistance, so that a layout area and parasitic capacitance can be reduced.

Moreover, since connection can be made with the power supply wirings immediately above the elements, a layout can be formed so that parasitic resistance of ESD surge current path in the ESD protecting element (power supply line from pad) is reduced and no current concentrates at a specific location. By disposing the input terminal resistance and the output buffer separately, MOSFET size and resistance element size can be designed independently between the output buffer and the input terminal resistance. Signals sent to the input differential circuit are captured from a drain end (connecting wiring 92) of the input terminal resistance. However, if the wiring is made for connection to the input pad, the signals may be captured from other locations. For example, the signals may be captured from the wiring 9 or 91, or adjacent terminal circuits.

The circuit operation of FIG. 29 or FIG. 30 is as follows. When data is inputted, the output MOSFETs 4u, 5u, 4d, and 5d are turned off, and the MOSFETs 1u, 2u, 1d, and 2d are turned on, whereby the circuit operates as an input terminal resistance. When data is outputted, the MOSFETs 4u, 5u, 4d, and 5d are turned on in accordance with whether data to be outputted is high level or low level, and MOSFETs 1u, 2u, 1d, and 2d are turned off, whereby the circuit operates as an output buffer.

Figure 31:
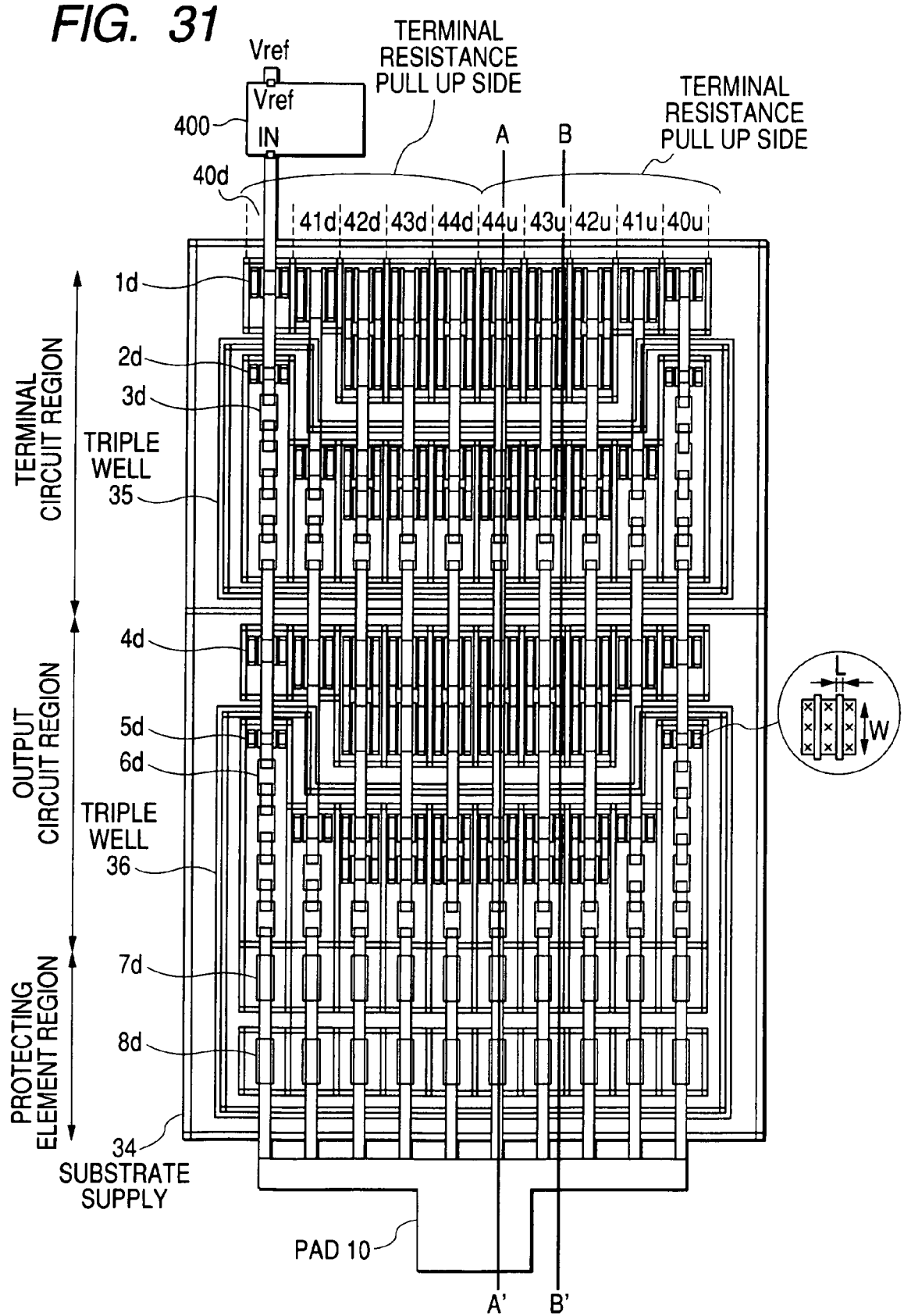
FIG. 31 is a concrete layout showing one embodiment of an input/output circuit with an input terminal resistance formed in the semiconductor integrated circuit according to the present invention.
Figure 32:
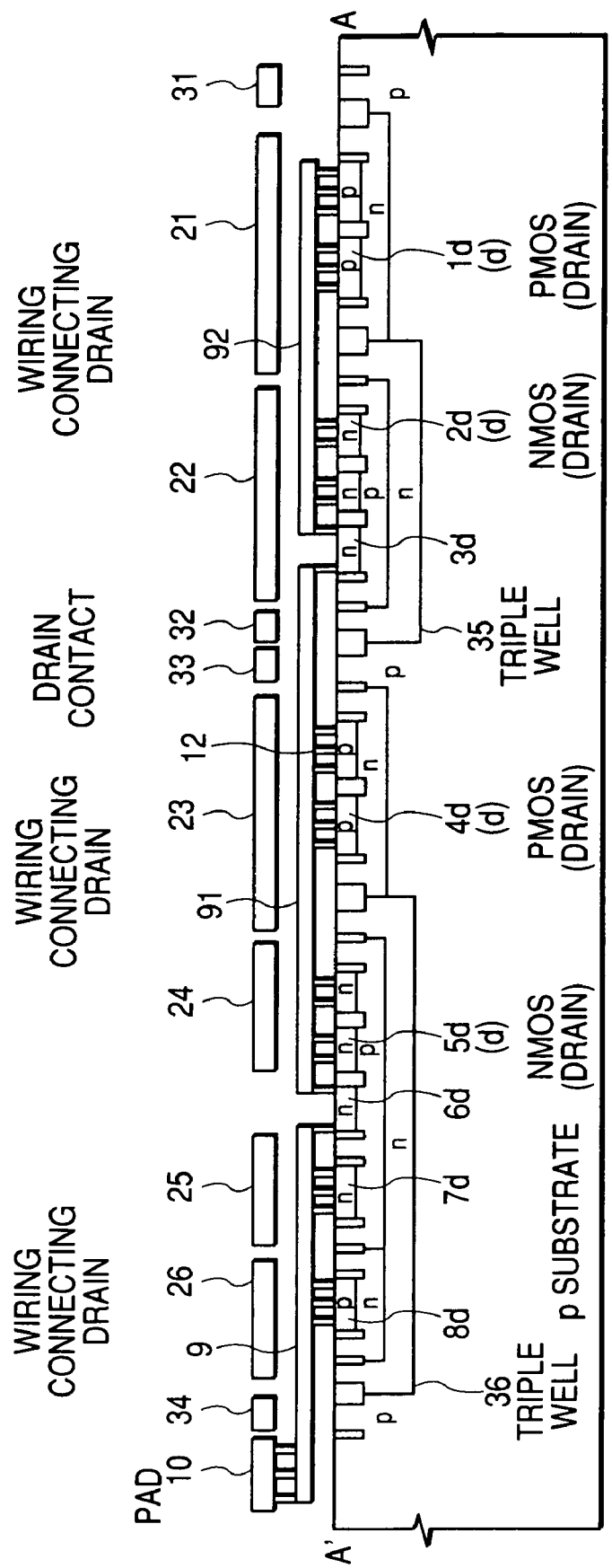
FIG. 32 is a sectional view of elements showing one embodiment in line A-A' of FIG. 31.
Figure 33:
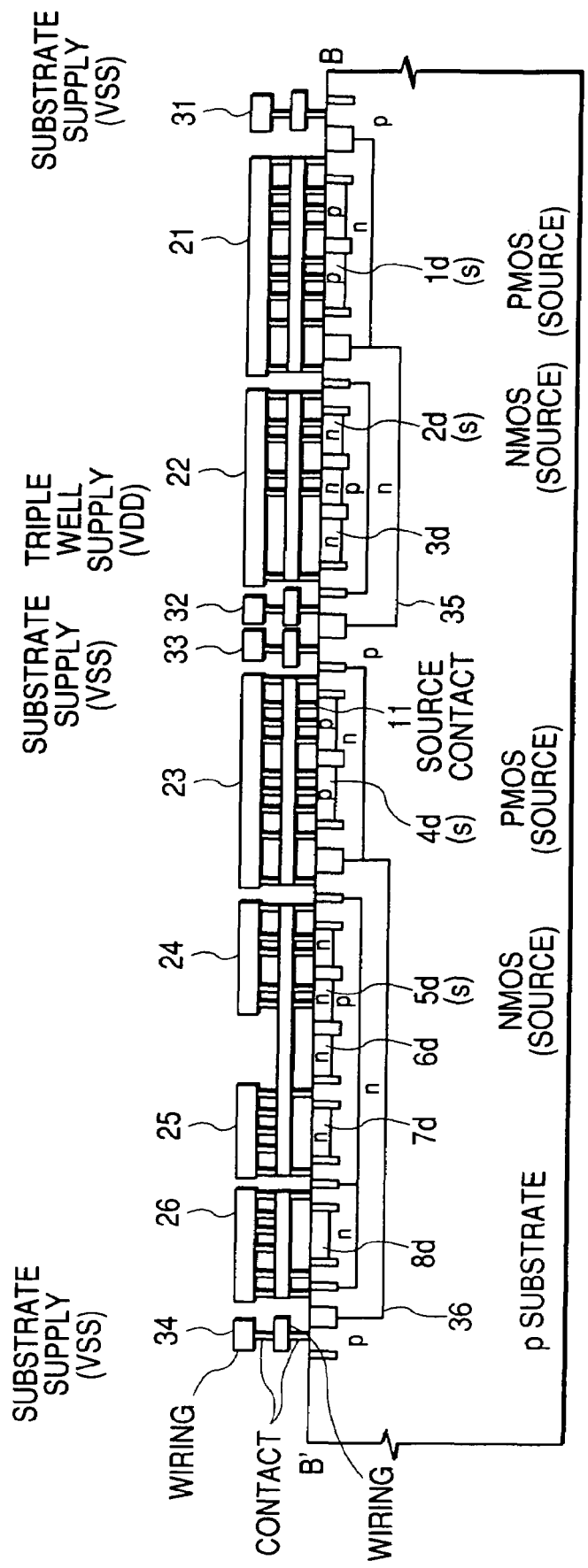
FIG. 33 is a sectional view of elements showing one embodiment in line B-B' of FIG. 31.
Figure 34:
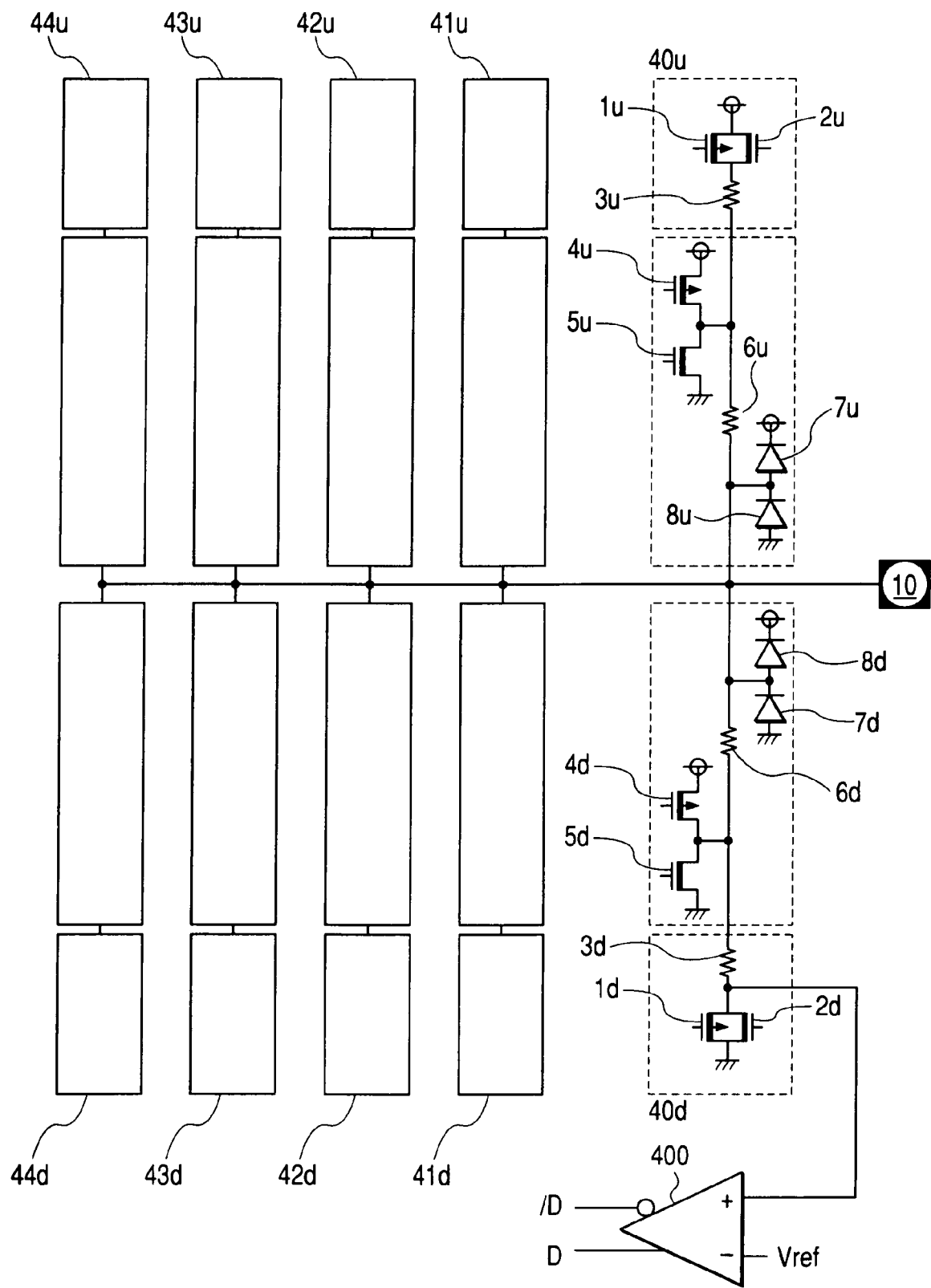
FIG. 34 is a diagram showing an equivalent circuit diagram of an input/output circuit shown in FIG. 31.

FIG. 31 is a concrete layout showing one embodiment of an input/output circuit with an input terminal resistance formed in the semiconductor integrated circuit according to the present invention. FIG. 32 is a sectional view showing elements of the input/output circuit of FIG. 31 taken along line A-A'. FIG. 33 is a sectional view showing elements of the input/output circuit of FIG. 31 taken along line B-B'. FIG. 34 shows an equivalent circuit diagram of the input/output circuit shown in FIG. 31.

In FIG. 31, to control the respective impedances of the terminal resistance and the output buffer, a layout with the basic units of FIG. 27 combined is shown. The impedances are controlled by geometrically dividing the input terminal resistance or output buffer and setting the total gate size of MOSFETs to be turned on. As an example, when the impedances of the terminal resistance pull-up side 40u, 41u, 42u, and 43u+44u in the embodiment of FIG. 31 or FIG. 34 are R1, R2, R3, and R4, respectively, they are connected in parallel with a ratio of 8:4:2:1 for R1, R2, R3, and R4.

Thus, by appropriately selecting MOSFETs to be turned on, 15 kinds of impedance controls from R1, R1/2, and R1/3 to R1/15 become possible. If impedances increase by multiples of two, that is, have a resistance ratio provided with a binary weight, R1-R4 can be selected by 4-bit binary code. Also, for the pull-down side and the output buffer, impedances can be controlled with the same principle.

In FIG. 31, if the terminal resistance 42u has Wn and Wp as the sizes of N-channel MOSFET and P-channel MOSFET, and S as the size of resistance element, 41u has values of Wn/2, Wp/2, and 2*S, respectively. 40u has values of Wn/4, Wp/4, and 4*S, respectively. Therefore, a layout can be formed so that decreases of MOSFETs and increases of resistance elements cancel out, resulting in no change in total column height.

In the sectional views of FIGS. 32 and 33, though the resistance elements 3d, 6d, 3u, and 6u are configured by N-type diffused resistors, poly-silicon resistors and high-resistance metal wirings may be substituted for them. As countermeasures against latch-up or the like, there are provided n-type triple wells for isolating N-channel MOSFETs from the p-type substrate, and well feed power in the periphery of MOSFET. However, these may be omitted as required. In FIG. 34, any one of the terminal MOSFETs 1u and 2u, and any one of 1d and 2d may be formed. MOSFETs 3u and 6u, and MOSFETs 3d and 6d may be respectively unified.

The electrical discharge ability of the ESD protecting element 7u, 8u, 7d, and 8d depends on the peripheral length of the diode. If the peripheral length is longer, a larger discharge current can be taken. Accordingly, to decrease the area of the elements under the same ESD resisting pressure, an effective method is to divide the elements into individual columns. However, if the elements can be designed between ESD permissible voltage and an element area limitation range, one or several of the elements may be collected immediately after the pad 10. Though there are ten combinations of columns in the embodiment of FIG. 31, any number of combinations of columns may be used if required for the design.

Figure 35:
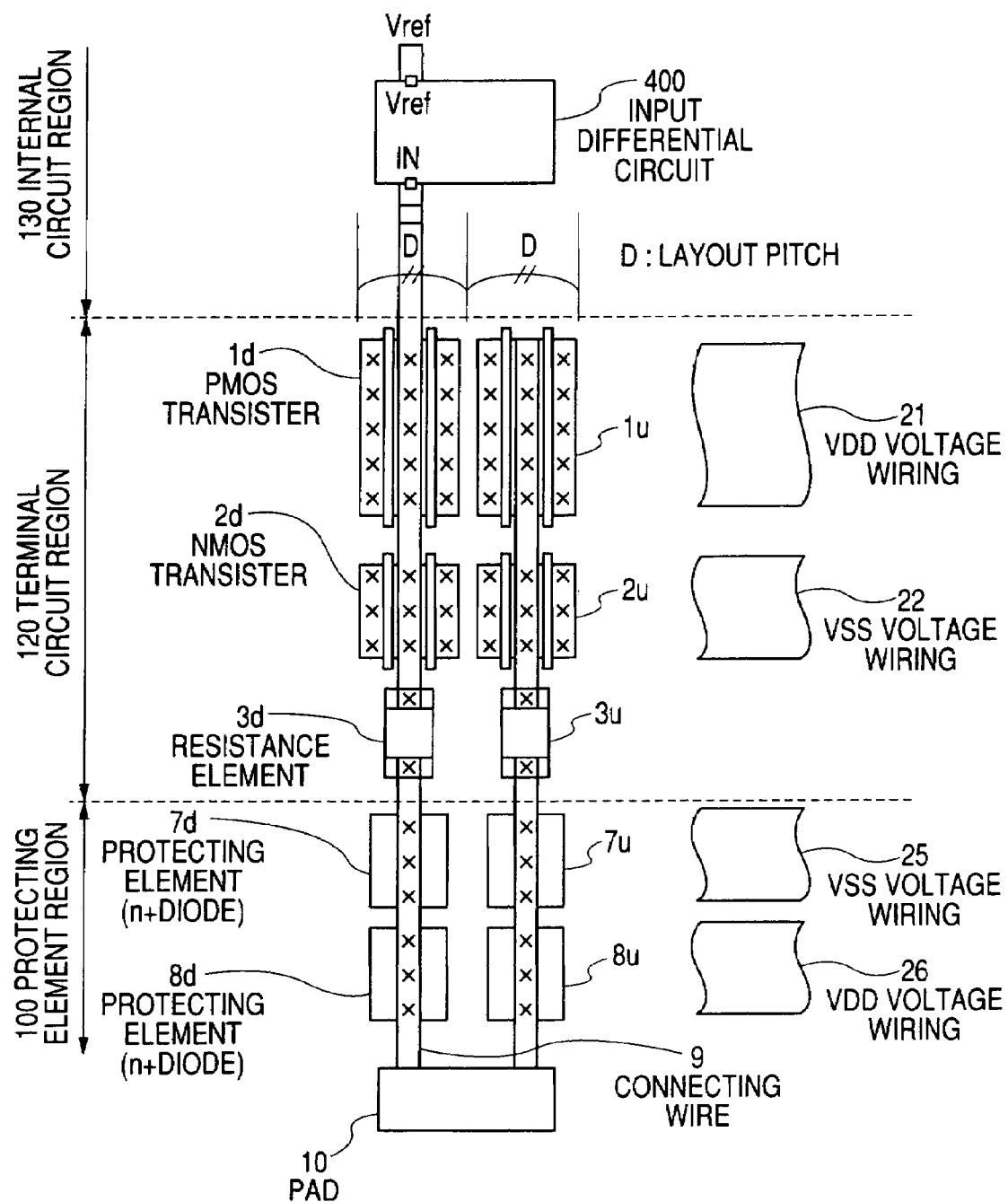
FIG. 35 is a layout diagram showing one embodiment of an input circuit with an input terminal resistance in the semiconductor integrated circuit according to the present invention.
Figure 36:
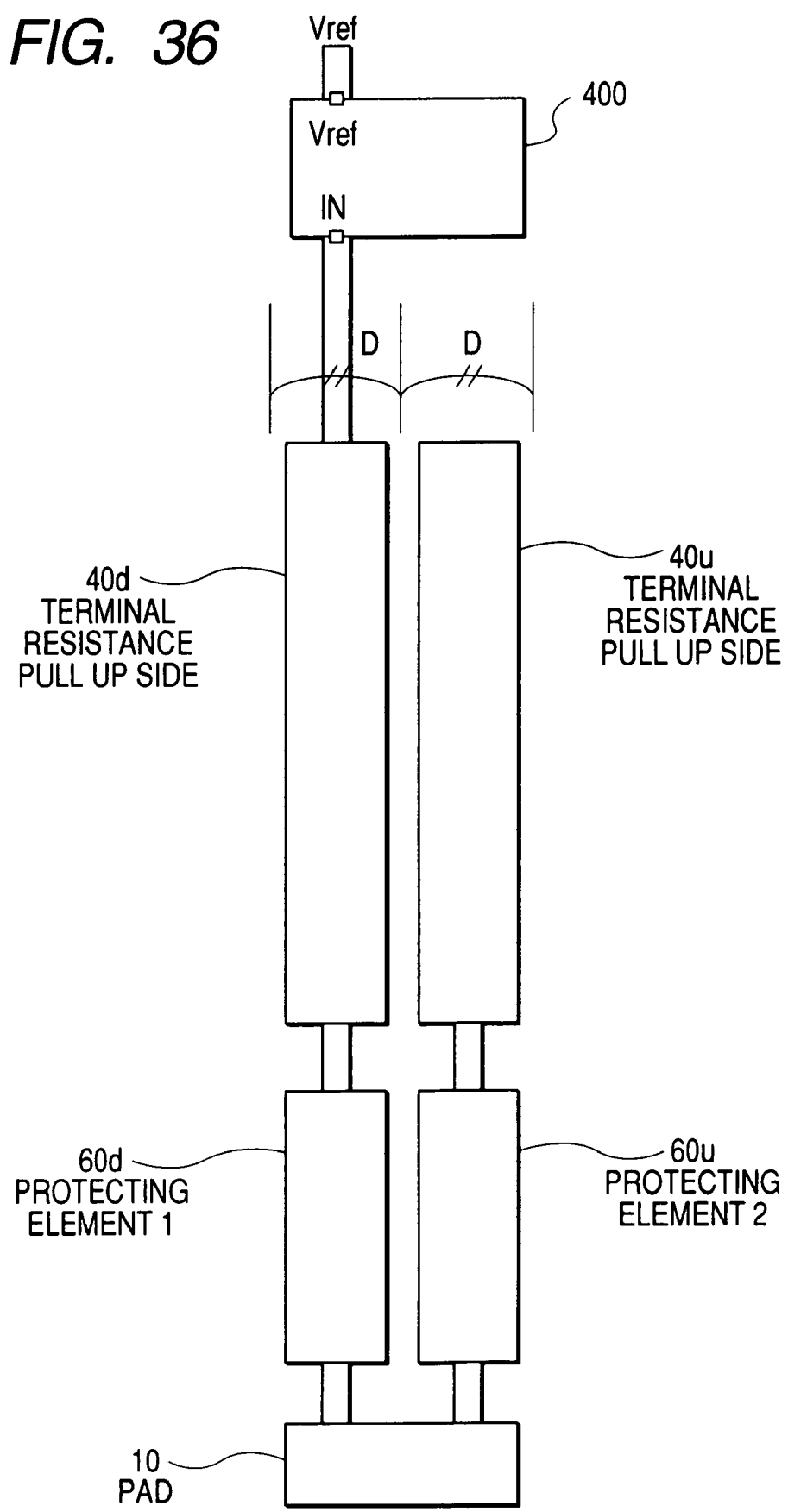
FIG. 36 is a layout diagram showing a block structure of an input circuit of FIG. 35.
Figure 37:
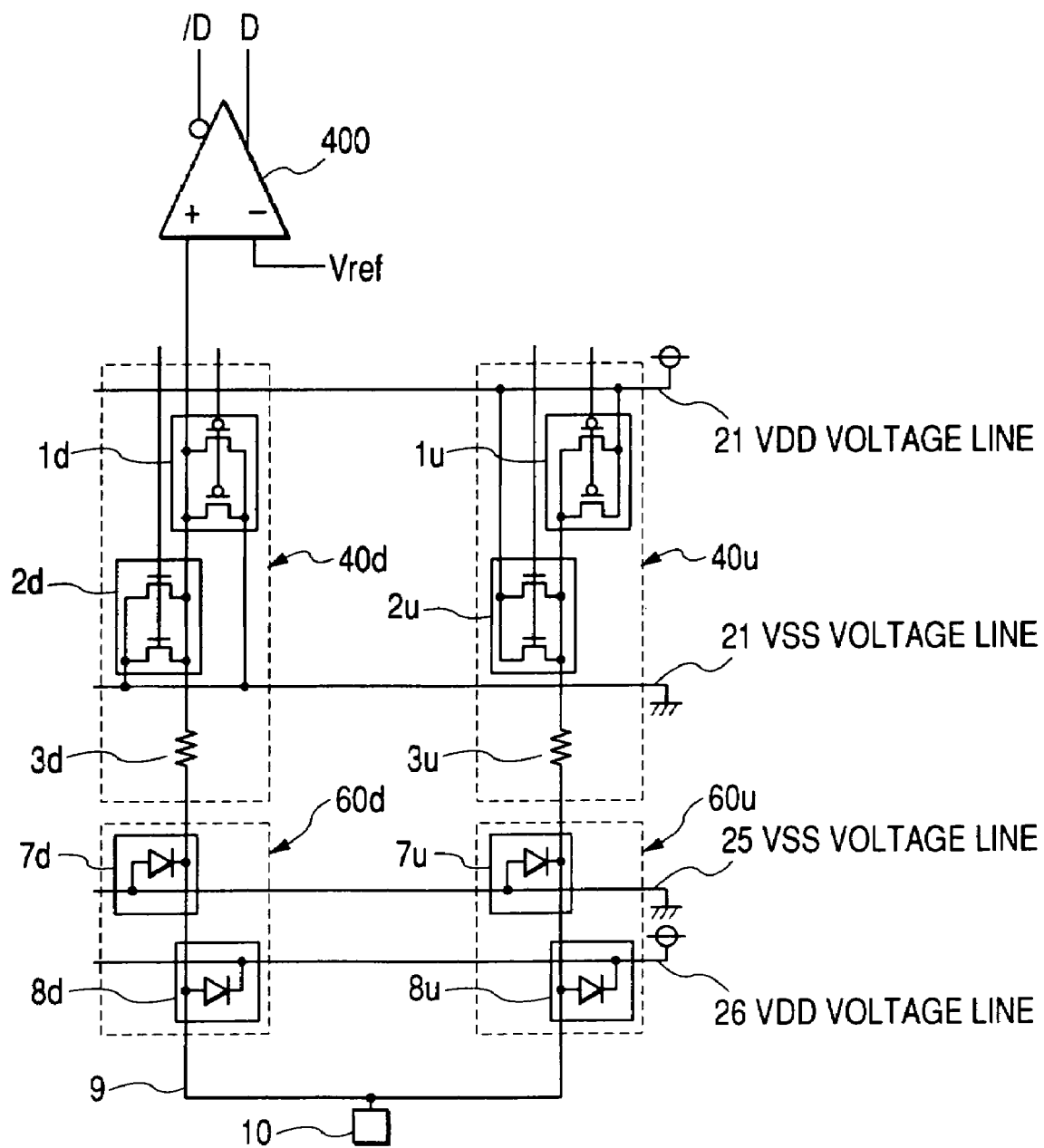
FIG. 37 is a diagram showing an equivalent circuit of an input circuit of FIG. 35.
Figure 38:
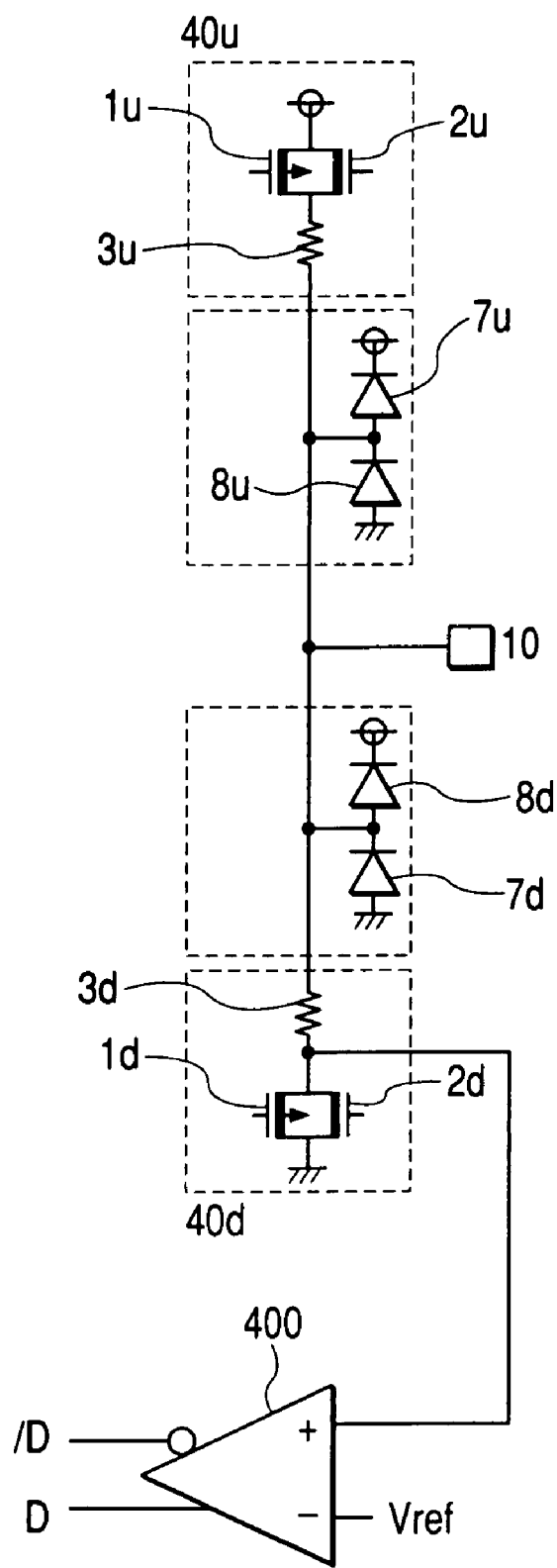
FIG. 38 is a circuit diagram showing an easy-to-understand deformation of an input circuit of FIG. 37.

FIG. 35 shows a layout of one embodiment of an input circuit with an input terminal resistance in the semiconductor integrated circuit according to the present invention. FIG. 36 is a layout diagram showing a block structure of the input circuit of FIG. 35. FIG. 37 shows an equivalent circuit of the circuit of FIG. 35. FIG. 38 is a circuit diagram showing an easy-to-understand deformation of the circuit of FIG. 37.

The embodiment of FIG. 35 relates to a layout example of an input terminal circuit in an input dedicated circuit. Specifically, the circuit of this embodiment is the same as the circuit of the embodiment of FIG. 27, except that the output circuit region 110 is removed, and protecting elements and a resistance element of a terminal circuit region 120 are connected. Accordingly, since the protecting elements and the terminal circuit except the output buffer in FIGS. 27 to 34 are the same as those of the circuit of this embodiment, duplicate descriptions of them are omitted. Therefore, the cross-sectional structure of the circuit can be formed as in FIGS. 32 and 33, except for the description of the output buffer.

Figure 39:
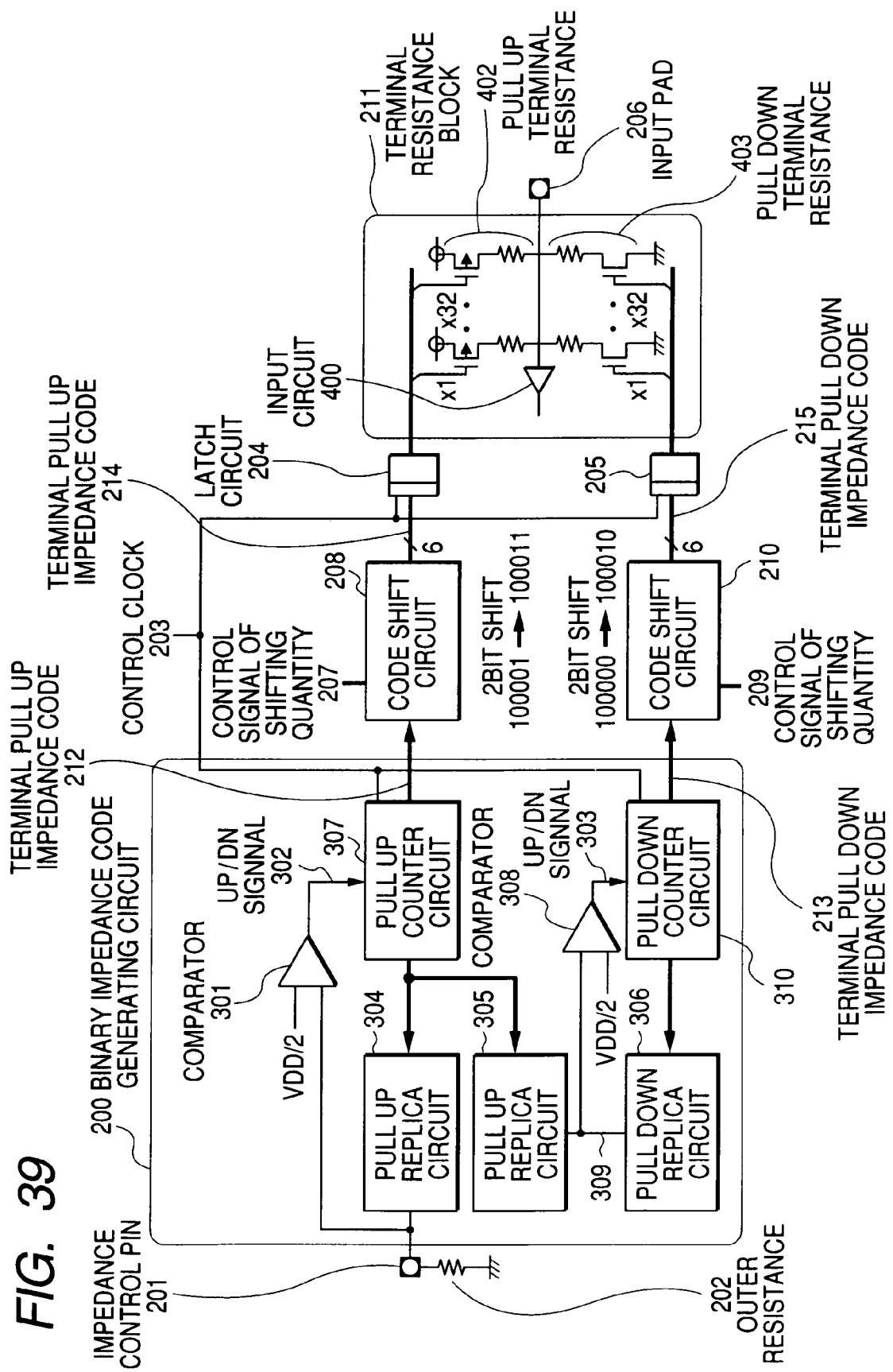
FIG. 39 is a block diagram showing one embodiment of an impedance control circuit of a terminal resistance according to the present invention.

FIG. 39 shows a block diagram of one embodiment of an impedance control circuit of a terminal resistance. In a binary impedance code generation circuit 200, a comparator 301 sets reference voltage at VDD/2 so that a resistance value of a resistance element 202 connected between the LSI control pin 201 and ground (ground potential VSS of the circuit) becomes equal to an on-state resistance value of a terminal replica circuit 304 within LSI, in other words, voltage of the impedance control pin 201 becomes equal to half the power voltage VDD. Moreover, a feedback loop is formed by a pull-up code counter circuit 307, and a pull-up replica circuit 304 controlled by it to generate impedance control code 212 for pull-up terminal. In other words, a count value of the pull-up code counter circuit is set by the feedback loop so that voltage of the impedance control pin 201 becomes closest to VDD/2.

Impedance control code 213 for pull-down terminal is also generated in the same way. Specifically, a circuit for dividing the power voltage VDD is configured by a pull-up replica circuit 305 of the same configuration as the pull-up replica circuit 304 and a pull-down replica circuit 306. Moreover, a comparator 308 sets reference voltage at VDD/2 so that voltage of its voltage dividing point 309 is half the power voltage VDD, and a feedback loop is formed by a pull-up code counter circuit 310, and a pull-up replica circuit 306 controlled by it to generate the impedance control code 213 for pull-up terminal.

As described above, reference voltage of the comparator 301 is half the power voltages VDD. When impedance code of the pull-down side is generated, the replica circuit 305, which is a copy of the pull-up replica circuit 304, can be substituted for the outer resistance 202, providing the advantage that circuit configuration can be simplified.

Next, the generated impedance codes are shifted by an arbitrary bit number in code shift circuits 208 and 210. A shifting quantity is set by control signals 207 and 209. This is done for the purpose of adjustments by 2-bit code shifting to solve the following problem. Because of the nonlinearity of on-state resistance of MOSFET, as input voltage deviates from VDD/2, terminal resistance values deviate to higher values.

Impedance code 214 for terminal pull-up formed by the code shift circuit 208 is temporarily captured into the latch circuit 204 operating on a control clock. Through the latch circuit 204, the impedance code 214 is passed to gates of P-channel MOSFETs constituting a pull-up side terminal resistance 402 making up a terminal resistance block. The P-channel MOSFETs each are formed so as to have a resistance value having a binary weight such as ×1 to ×32. Similarly, impedance code 215 for terminal pull-down formed by the code shift circuit 210 is temporarily captured into the latch circuit 205 operating on a control clock. Through the latch circuit 205, the impedance code 214 is passed to gates of N-channel MOSFETs constituting a pull-down side terminal resistance 403 making up a terminal resistance block. The N-channel MOSFETs each are formed so as to have a resistance value having a binary weight such as ×1 to ×32.

Also in this embodiment, like the impedance control of the output buffers, since on-state resistance values of MOSFET have source-drain voltage dependency, the resistance elements are connected in series with MOSFETs to improve its linearity. A resistance value having a binary weight such as x1 to x32 includes those of the above-mentioned resistance elements.

Figure 40:
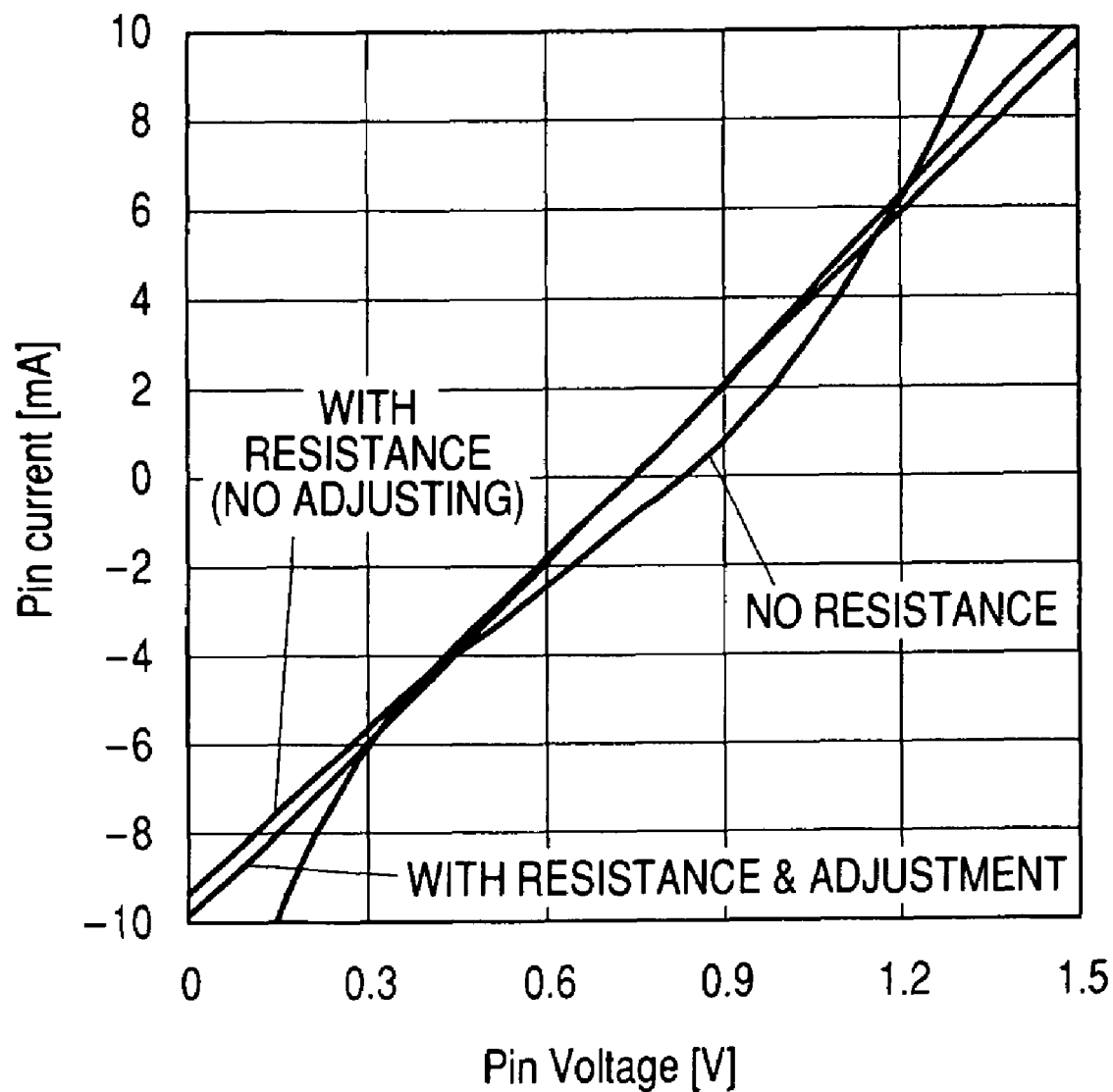
FIG. 40 is a current-voltage characteristic diagram for explaining an impedance control circuit shown in FIG. 39.

FIG. 40 shows a current-voltage characteristic diagram for explaining resistance elements of the embodiment of FIG. 39, and a terminal resistance error depending on whether code shifting has been performed. The current-voltage characteristics indicate a result obtained by circuit simulation. If no adjustments have been made, influence of nonlinearity of MOSFET appears and resistance to a current flow becomes higher as input potential departs from VDD/2. If the terminal resistance is configured by only MOSFETs without using the resistance elements, as input potential departs from VDD/2, the respective characteristics of N-channel MOSFETs and P-channel MOSFETs begin to appear conspicuously, an error of the terminal resistance becomes larger, and equivalent bias voltage of the terminal circuit departs from VDD/2.

Figure 41:
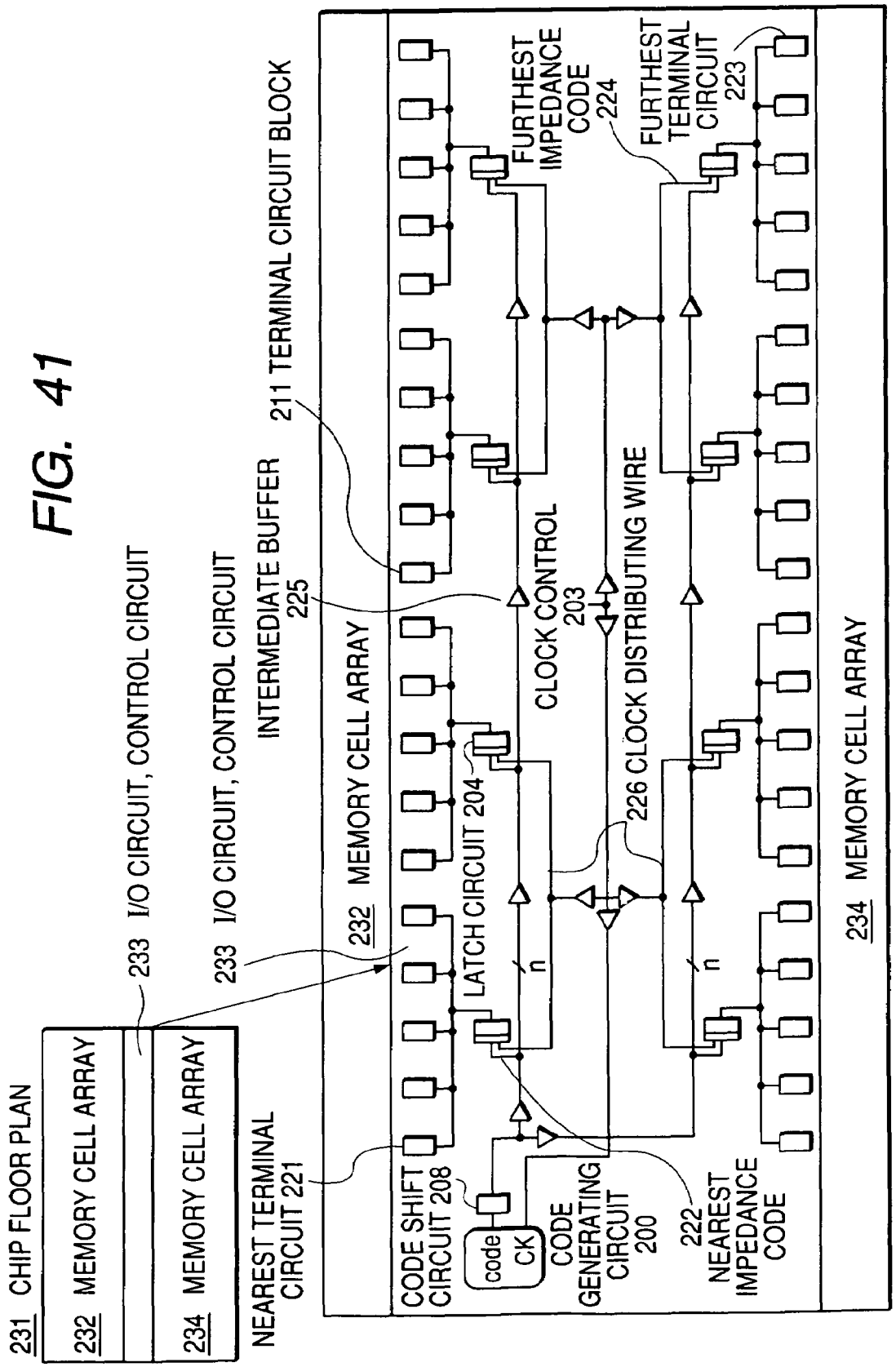
FIG. 41 is a block diagram showing one embodiment of an impedance control circuit of terminal resistance in a semiconductor memory chip according to the present invention.

FIG. 41 is a block diagram showing one embodiment of an impedance control circuit of terminal resistance in a semiconductor memory chip according to the present invention. Circuit blocks including a terminal circuit of the figure are shown according to geometrical disposition on an actual semiconductor chip.

In a chip floor plan of semiconductor memory of this embodiment, an input/output circuit I/O and a control circuit are disposed at a central portion lengthwise of a rectangular semiconductor chip so that they are sandwiched between memory cell arrays 232 and 234. When impedance codes are distributed to input terminal circuits provided in the enlarged central portion, to eliminate variations in terminal impedance values among input pins, synchronization must be established among the terminal circuits to switch (update) the codes.

When the terminal circuits are disposed in a wide range within the chip, that is, when they are disposed to such a wide range that distribution delay of impedance code is larger than cycles of impedance code signal generation, according to a distance from a code generating circuit 200, for example, between a nearest input terminal 221 and a furthest input terminal 222, new code and old code coexist depending on the distribution delay, and impedance values may appear to be variable. A method for preventing this is to update all terminal impedances within cycles of impedance code signal generation. However, in some cases, use of this method may be difficult because of severer design requirements in comparison with impedance control such as limitations of disposition location of a code generating circuit and limitations of disposition locations of terminal circuits of distribution destinations within a chip.

As a measure for them, in this embodiment, when impedance codes are distributed to the terminal circuits, plural latches for holding the codes are disposed near the terminal circuits and synchronized by a control clock of equal skew, whereby same impedance codes are generated between the furthest and nearest terminal circuits. In other words, since the nearest terminal circuit 221 and the furthest terminal circuit 222 capture the impedance codes synchronously by a control clock of equal skew, variations in the impedance values can be prevented.

Figure 42:
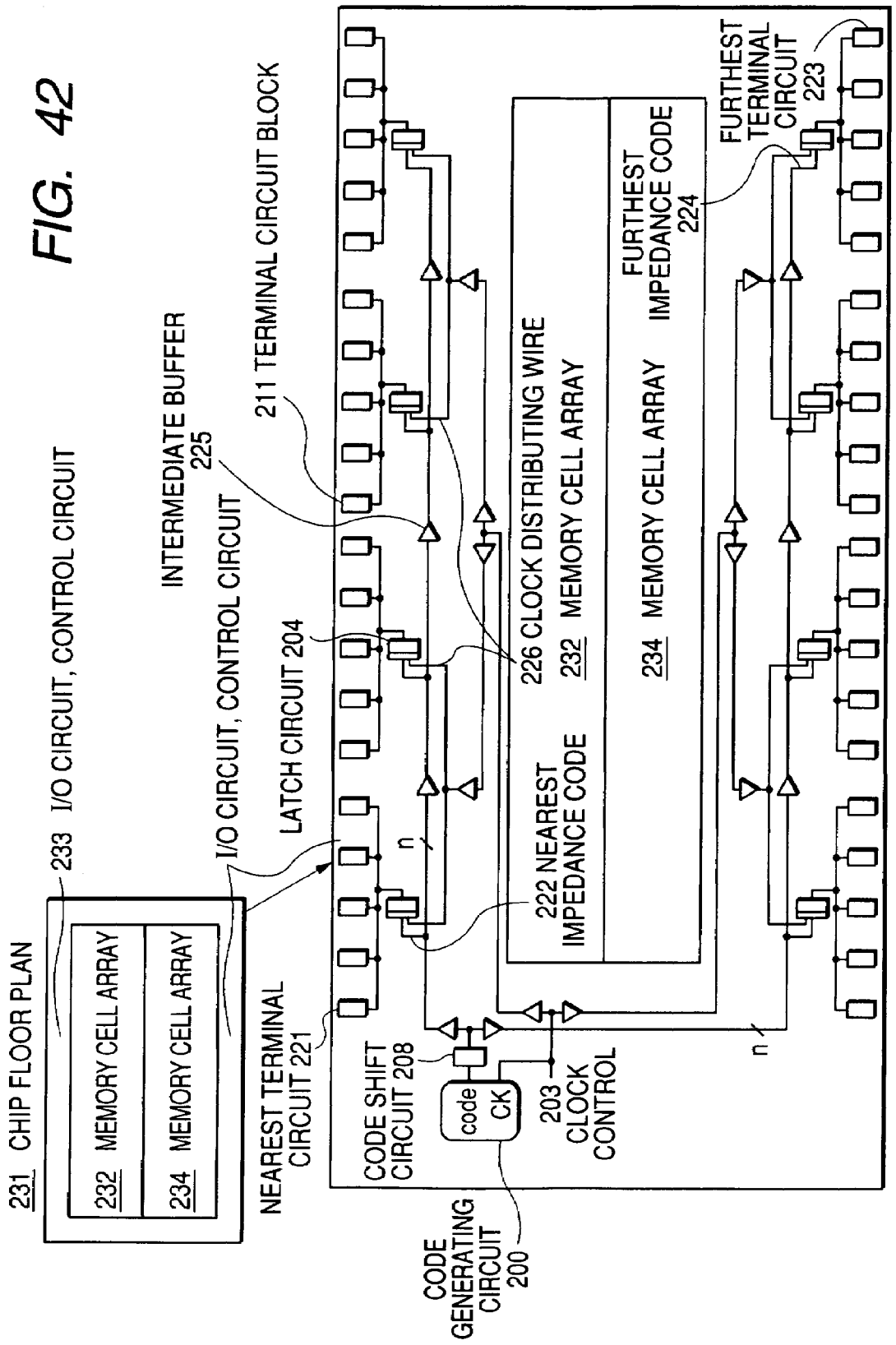
FIG. 42 is a block diagram showing another embodiment of an impedance control circuit of terminal resistance in the semiconductor memory chip according to the present invention.

FIG. 42 is a block diagram showing another embodiment of an impedance control circuit of terminal resistance in the semiconductor memory chip according to the present invention. This embodiment is a variant of the embodiment of FIG. 41, and is different from it in that an input/output circuit is disposed on the periphery of the chip, and memory cell arrays are disposed at the center of the chip. Also in such a memory chip, by disposing latches near the terminal circuits and establishing synchronization among them by a control clock, impedance codes among pins at a given cycle are made the same. As for the above-mentioned code shifting and distributed disposition of code holding latches, impedance control codes may be generated in the generating circuit within the chip, or control codes themselves may be used directly from external pins or indirectly.

Figure 43:
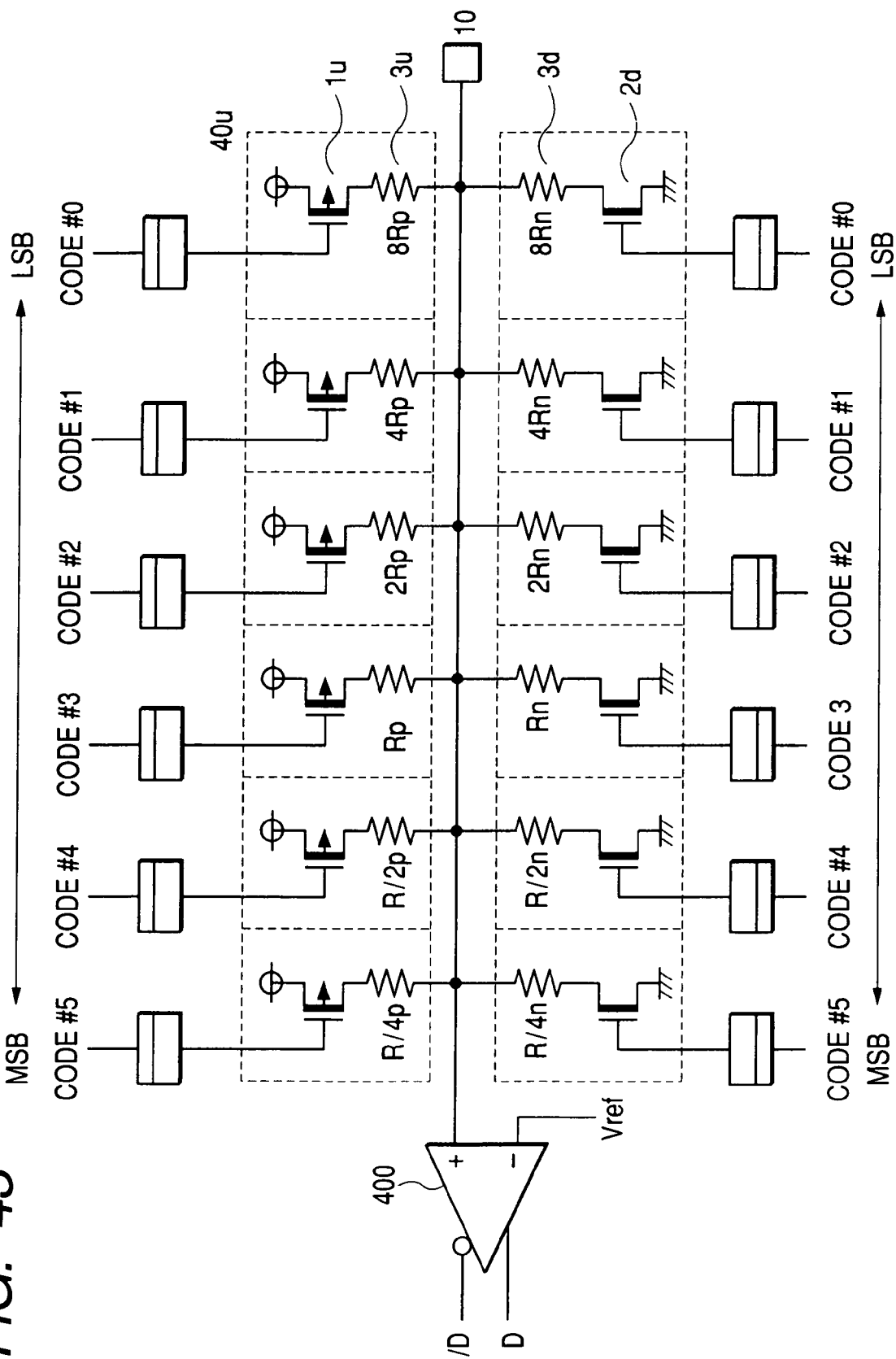
FIG. 43 is a circuit diagram showing one embodiment of a terminal resistance block according to the present invention.

FIG. 43 is a circuit diagram showing one embodiment of a terminal resistance block according to the present invention. A terminal resistance of this embodiment includes MOSFETs and resistance elements connected with them, and is formed to have a resistance value of binary weight. Specifically, correspondingly to 6-bit binary code of six bits consisting of code #0 (LSB), code #1, code #2, code #3, code #4, and code #5 (MSB), resistance values are set to 8Rp, 8Rn, 4Rp, 4Rn, 2Rp, 2Rn, Rp, Rn, Rp/2, Rn/2, Rp/4, and Rn/4. The codes #0 to #5 are respectively captured into latch circuits. The codes captured into the latch circuits are passed to gates of P-channel MOSFETs and N-channel MOSFETs.

Figure 44:
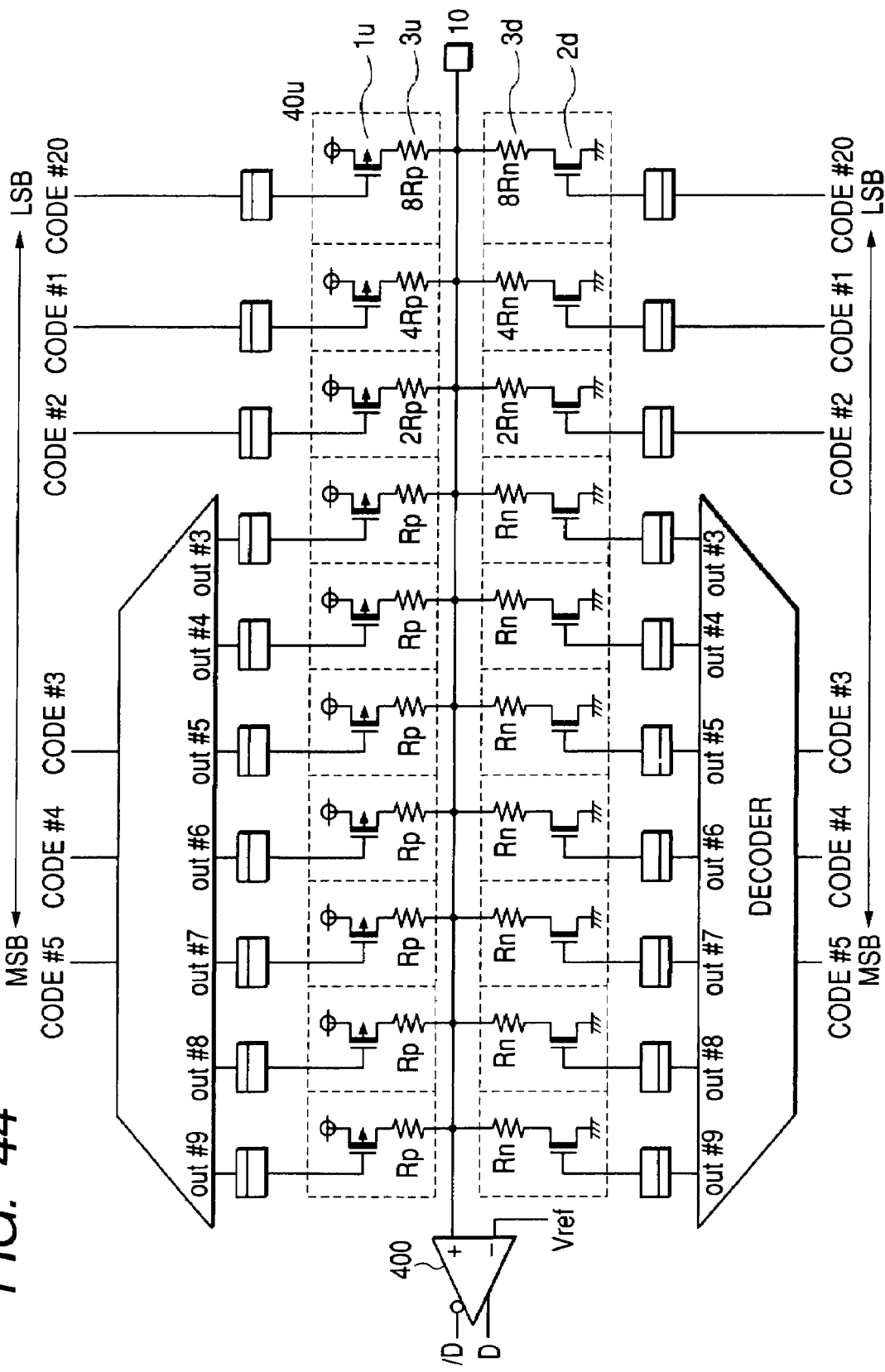
FIG. 44 is a circuit diagram showing another embodiment of a terminal resistance block according to the present invention.

FIG. 44 shows a circuit diagram of another embodiment of a terminal resistance block according to the present invention. A terminal resistance of this embodiment comprises two portions; one portion includes MOSFETs and resistance elements connected with them correspondingly to binary code, and has a resistance value of one of binary weights 8Rp, 8Rn to 2Rp, and 2Rn; and the other decodes binary code by a decoder and has a resistance value Rp or Rn corresponding to thermometer code.

Among the codes #0 to #5 making up the 6-bit binary codes, 3 bits consisting of the low-order codes #0 to #2 are passed to gates of corresponding MOSFETs formed to have binary weights 8Rp, 8Rn, 4Rp, 4Rn, 2Rp, and 2Rn as in the embodiment of FIG. 43. On the other hand, 3 bits consisting of the high-order codes #3 to #5 are passed to the decoder. The decoder converts the binary code into thermometer code, as described above.

When code #3-#5 is 000, the decoder outputs 0000000 as output code out#3-out#9. When codes #3-#5 increase by +1 to 001, output code out#3-out#9 becomes 0000001. When code #3-#5 further increases by +1 to 010, output code out#3-out#9 becomes 0000011. When code #3-#5 further increases by +1 to 011, output code out#3-out#9 becomes 0000111. In this way, each time the binary code #3-#5 increases by 1, thermometer code is formed so as to increase the number of MOSFETs to be turned on by one.

Portions having small impedance in the terminal circuit thus divided are further equally divided. Specifically, the binary codes 214 and 215 distributed in FIG. 39 are decoded in accordance with the number of divisions. In this embodiment, high-order 3 bits of 6-bit binary code are divided by seven, and switching is made one circuit at a time in accordance with code #, using the thermometer codes. As a result, in a portion having the smallest impedance before impedance switching, the impedance is quadrupled, from R/32 to R/8. As described later, an impedance change quantity in code transition state can be reduced. By such division of high-order code, the total size of transistors updated at a time can be reduced, and the gap of impedance changes in update transition state is reduced.

Figure 45:
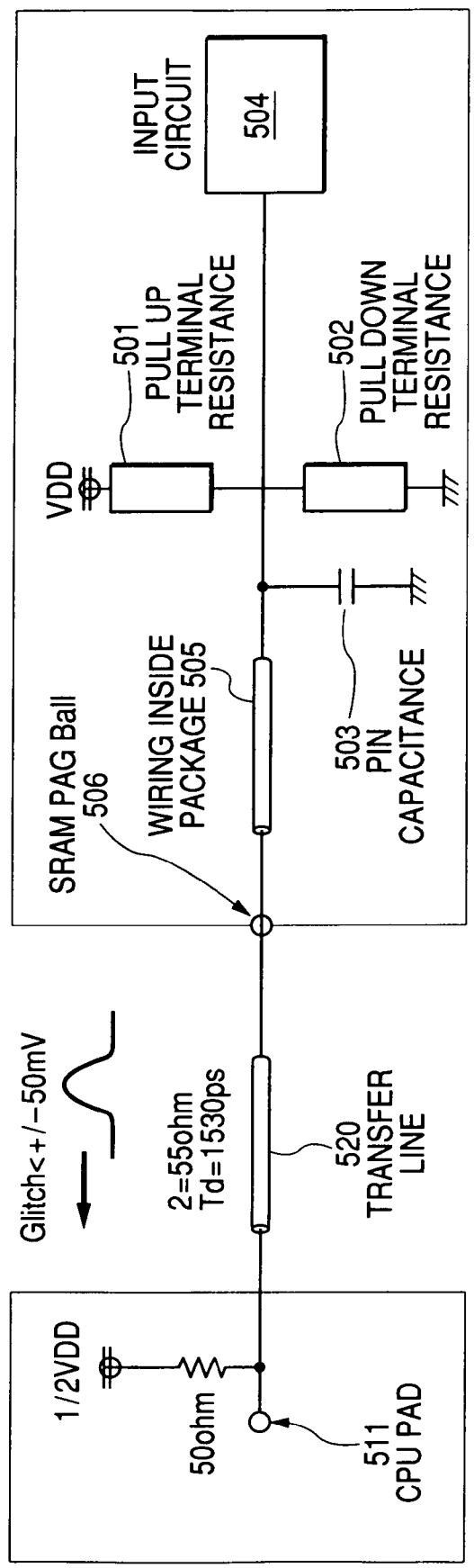
FIG. 45 is a block diagram showing a model circuit for evaluating transitional impedance changes in terminal resistance circuits of FIGS. 43 and 44 by simulation.

FIG. 45 shows a model circuit for quantifying and evaluating transitional impedance changes in the terminal resistance circuit by simulation described below. SRAM PKG Ball 506 designates an SRAM input pin, which connects with a pull-up terminal resistance 501, a pull-down terminal resistance 502, and an input circuit 504 through a wiring 505 inside the package. Pin capacitance 503 is added to the wiring 505 inside the package as parasitic capacitance. Write data, address signals, and control signals are passed from CPU PAD 511 to SRAM through a transmission line 520. The transmission line 520 is set to characteristic impedance Z (=55 ohms).

Figure 46:
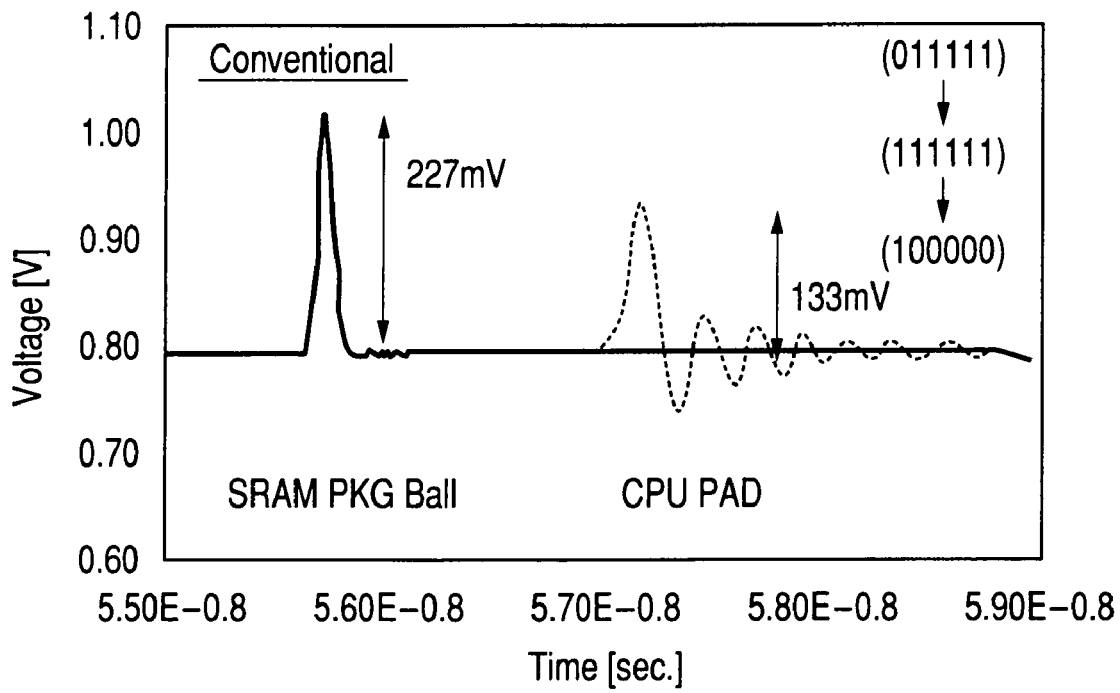
FIG. 46 is a diagram showing a noise waveform produced by simulation in the case where a terminal circuit shown in FIG. 43 is used.

FIG. 46 shows a noise waveform produced by simulation in the case where the terminal circuit shown in FIG. 43 is used. In this embodiment, impedance codes are updated from code # (011111) to code # (100000). During such code transition, when a state of code # (111111) or code # (000000) occurs temporarily, all MOSFETs of the terminal circuit go on or off, and noise is observed in the SRAM input pin and the CPU PAD. In this simulation, a noise quantity 227 mV is not trivial to power voltage 1.6 V; an input waveform may be distorted and SRAM may malfunction. Accordingly, when the terminal circuit shown in FIG. 43 is used, the circuit must be devised so that a state of code # (111111) or code # (000000) does not occur temporarily.

Figure 47:
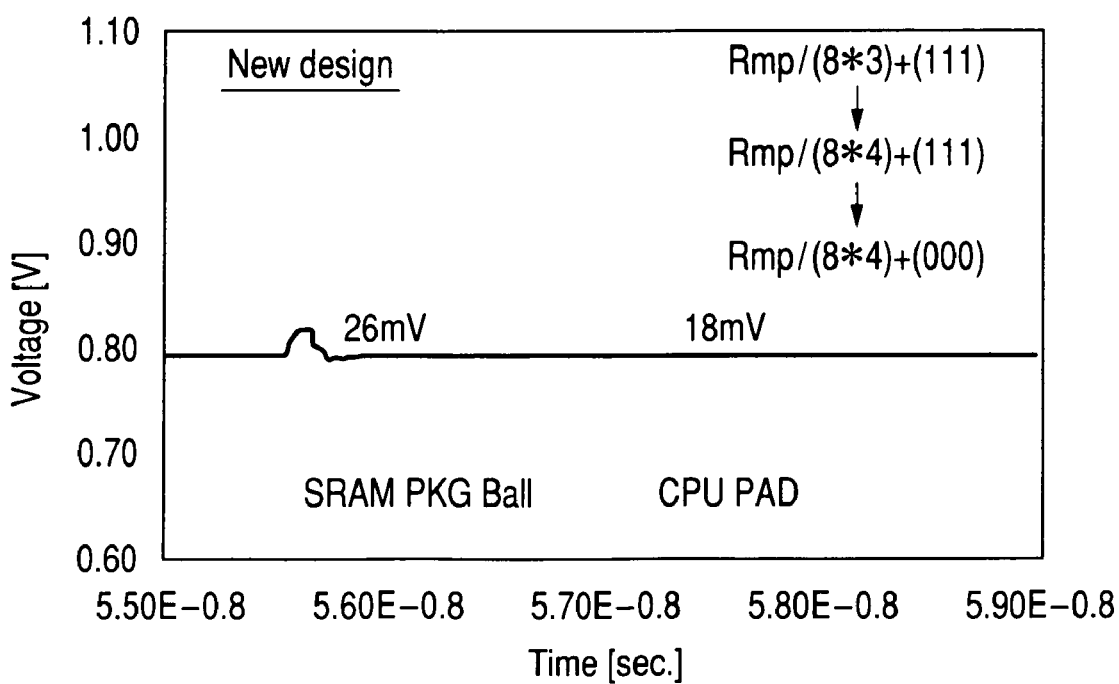
FIG. 47 is a diagram showing a noise waveform produced by simulation in the case where a terminal circuit shown in FIG. 44 is used.

FIG. 47 shows a noise waveform produced by simulation in the case where the terminal resistance shown in FIG. 44 is used. Like the preceding embodiment, impedance codes are updated from code # (011111) to code # (100000). During such code transition, even if a state of code # (111111) or code # (000000) occurs temporarily, by the action of the decoder, the code is converted into code # (100111) or # (011000). Not all MOSFETS of the terminal circuit go on or off, with the effect that a noise quantity in the input pin can be reduced up to 26 mV.

Like the semiconductor integrated circuit of this embodiment, the following layout is used as a basic unit. That is, an input pad, ESD protecting element, resistance, and MOSFET disposed in that order are connected through one wiring. As many basic units as required for impedance control are disposed in parallel to form one terminal resistance as a stripe layout, whereby a high degree of integration can be achieved. For input/output common pins, an output buffer is also formed as a stripe layout so as to bring pitches in a gate length direction of the terminal resistance layout into agreement, whereby a high degree of integration can be achieved.

An input terminal resistance and an output buffer have a circuit structure divided according to impedance control range and control accuracy. A division method is e.g., geometric division (1, 2, 4, 8 . . . ). Impedance is controlled by switching the divided portions by binary code. One divided cell comprises PMOS and resistance element in a pull-up terminal, and NMOS and resistance element in a pull-down terminal, with the high ratio of resistance to on-state resistance such as 1:3 to assure linearity of terminal resistance.

In the preceding embodiment, as stripe layout, by bringing pitches of basic units of output buffer and terminal resistance into agreement, bypass wirings for wiring connection becomes unnecessary, so that layout area and pin capacity can be reduced. By using a structure with resistance elements and MOSFETs combined, since nonlinearity of on-state resistance of the MOSFETs is made up for by the resistance elements, source-to-drain voltage drops, hot carrier induced degradation can be reduced, and terminal impedance can be stabilized independently of input potential.

In the semiconductor integrated circuit according to the present invention, the terminal circuits are disposed within the chip, and the output impedance of output buffers are matched to the characteristic impedance of transmission lines. Accordingly, if the semiconductor integrated circuit according to the present invention is mounted in the system, even if no terminal resistance exists in an input terminal of a semiconductor integrated circuit of a party transferring signals, since re-reflected noise can be eliminated by the output impedance, data transfer at high frequencies is enabled. Or, even if the output impedance of a party transferring signals is not matched to the characteristic impedance of transmission lines, since reflected noise is not generated by the terminal circuit, data transfer at high frequencies is enabled. In this way, since the semiconductor integrated circuit according to the present invention enables rapid data transfer without connecting terminal resistance and the like on a mounting board making up the system, an easy-to-use and compact electronic device can be achieved.

Hereinbefore, though the invention made by the inventors of the present invention has been described in detail based on the preferred embodiments, it goes without saying that the present invention is not limited to the preferred embodiments, but may be modified in various ways without changing the main purports of the present invention. For example, difference (offset) may be provided between the respective resistances of pull-up and pull-down sides of terminal resistances. Thereby, when a differential clock pin is open when power is applied, malfunction due to noise generated in input pins can be prevented. A mode may be provided in which all terminal resistance circuits are turned off. Thereby, an increase in power consumption during low-frequency operation or burn-in operation can be suppressed. This invention can be widely used for various semiconductor integrated circuits, besides semiconductor memory.

Effects of the typical disclosures of the present invention will be summarized in brief as follows. An output circuit comprising plural MOSFETs connected in parallel is used, from among the plural MOSFETs, the number of MOSFETS to be turned on is selected by a first control means to control output impedance, and slew rate is controlled by controlling a drive signal of the MOSFETs turned on by a second control means. Thereby, impedance control and slew rate control can be set independently of each other, and the structure of a control circuit can be simplified.

An input circuit that receives input signals supplied from an external terminal is provided with a terminal circuit that is connected to the external terminal and comprises plural MOSFETs connected in parallel. The number of the plural MOSFETs to be turned on is controlled by a third control means to control a resistance value of terminal resistance, whereby the terminal circuit matched to signal transmission lines can be easily constructed.

For an output circuit to an external terminal of which output nodes of plural output MOSFETs connected in parallel are connected, the number of the plural MOSFETs to be turned on is selected by a first control means to control output impedance, and slew rate is controlled by controlling a drive signal of the MOSFETs turned on by a second control means. For an input circuit that receives input signals supplied from the external terminal, a terminal circuit including plural MOSFETs connected in parallel is connected to the external terminal through a switch circuit. The number of the plural MOSFETs to be turned on is controlled by a third control means to control a resistance value of terminal resistance, whereby rapid data transfer is enabled without connecting terminal resistance and the like on a mounting board making up the system. Therefore, an easy-to-use and compact electronic device can be achieved.

The invention claimed is:

1. A semiconductor integrated circuit comprising:
   an input circuit that receives input signals supplied from an external terminal;
   a terminal circuit that is connected to the external terminal and includes plural MOSFETs connected in parallel; and
   a control means that controls the number of the plural MOSFETs to be turned on to control a resistance value of terminal resistance,
   wherein the plural MOSFETs comprise a first MOSFET of a first conduction type disposed at power voltage side and second MOSFET of a second conduction type disposed at a ground potential side of the terminal circuit,
   wherein the first MOSFET and the second MOSFET are connected by one straight wiring to form a layout of a basic structure,
   two or more of the basic structures comprising the first MOSFET and the second MOSFET are disposed in parallel in a stripe form in a direction orthogonal to the wiring,
   wherein the control means includes a resistance element connected to the external terminal, and forms a signal for selecting the first MOSFET and the second MOSFET so as to produce a resistance value closest to a resistance value of the resistance element connected to the external terminal,
   wherein the first MOSFET and the second MOSFET respectively comprise plural pieces having an on-state resistance value of a binary weight, and are selectively turned on by a selection signal of binary code formed by the control means,
   wherein each of the first MOSFET and the second MOSFET comprises first plural pieces whose on-state resistance values have weights of low-order bits of the binary code, and second plural pieces each having the same on-state resistance value assigned to high-order bits of the binary code, and
   low-order bits of the selection signal of binary code formed by the control means are used to select corresponding MOSFETs of the first plural pieces from among the plural pieces of the first MOSFET and the second MOSFET, and code corresponding to the high-order bits is supplied to a decoder circuit and used to select corresponding MOSFETs of the second plural pieces.

2. The semiconductor integrated circuit according to claim 1,
   wherein each of the stripe forms further includes an antistatic diode connected correspondingly to the straight wirings.

3. A semiconductor integrated circuit comprising:
   an input circuit that receives input signals supplied from an external terminal;

a terminal circuit that is connected to the external terminal and includes plural MOSFETs connected in parallel; and a control means that controls the number of the plural MOSFETS to be turned on to control a resistance value of terminal resistance, wherein the plural MOSFETs comprise a first MOSFET of a first conduction type disposed at power voltage side and second MOSFET of a second conduction type disposed at a ground potential side of the terminal circuit, wherein the first MOSFET and the second MOSFET are connected by one straight wiring to form a layout of a basic structure, two or more of the basic structures comprising the first MOSFET and the second MOSFET are disposed in parallel in a stripe form in a direction orthogonal to the wiring, wherein the control means includes a resistance element connected to the external terminal, and forms a signal for selecting the first MOSFET and the second MOSFET so as to produce a resistance value closest to a resistance value of the resistance element connected to the external terminal, wherein the first MOSFET and the second MOSFET respectively comprise plural pieces having an on-state resistance value of a binary weight, and are selectively turned on by a selection signal of binary code formed by the control means, wherein the control means comprises:

a resistance element connected to the external terminal;

a first circuit that forms a binary control signal for a first replica circuit so as to bring partial output of power voltage formed by the first replica circuit of the first MOSFET and a midpoint voltage of the power voltage nearest to each other; and a second circuit, controlled by the binary control signal formed by the first circuit, that forms a binary control signal for a third replica circuit so as to bring partial output of power voltage formed by a second replica circuit corresponding to the first MOSFET and the third replica circuit of the second MOSFET and a midpoint voltage of the power voltage nearest to each other, wherein the binary control signal of the first circuit is conveyed as a selection signal of the first MOSFET, and the binary control signal of the second circuit is conveyed as a selection signal of the second MOSFET.

4. The semiconductor integrated circuit according to claim 3, wherein the binary control signal of the first circuit and the binary control signal of the second circuit are respectively conveyed to shift circuits, and corrected selection signals are respectively conveyed to the first MOSFET and the second MOSFET.

* * * * *